US010636470B2

(12) United States Patent
Lee et al.

(10) Patent No.: US 10,636,470 B2
(45) Date of Patent: Apr. 28, 2020

(54) SOURCE FOLLOWER-BASED SENSING SCHEME

(71) Applicant: Micron Technology, Inc., Boise, ID (US)

(72) Inventors: Hyun Yoo Lee, Boise, ID (US); Suryanarayana B. Tatapudi, Boise, ID (US); Huy T. Vo, Boise, ID (US); Ferdinando Bedeschi, Biassono (IT); Umberto Di Vincenzo, Capriate San Gervasio (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/121,224

(22) Filed: Sep. 4, 2018

(65) Prior Publication Data

US 2020/0075076 A1    Mar. 5, 2020

(51) Int. Cl.
*G11C 11/22* (2006.01)
*G11C 11/4094* (2006.01)
*G11C 11/4091* (2006.01)

(52) U.S. Cl.
CPC ........ *G11C 11/2273* (2013.01); *G11C 11/221* (2013.01); *G11C 11/4091* (2013.01); *G11C 11/4094* (2013.01)

(58) Field of Classification Search
CPC .................................. G11C 7/08; G11C 7/06
USPC .................................................. 365/205, 207
See application file for complete search history.

(56) References Cited

U.S. PATENT DOCUMENTS

| 4,871,978 | A | * | 10/1989 | Galbraith | H03K 3/356113 330/253 |
|---|---|---|---|---|---|
| 5,063,540 | A | * | 11/1991 | Takahashi | G11C 7/12 327/108 |
| 5,239,507 | A | * | 8/1993 | Ohba | G11C 7/1069 365/189.06 |
| 5,977,798 | A | * | 11/1999 | Zerbe | H03K 3/356121 326/115 |
| 6,292,418 | B1 | * | 9/2001 | Kawashima | G11C 7/065 365/203 |
| 6,448,818 | B1 | * | 9/2002 | Fletcher | G06F 7/506 326/114 |
| 6,574,135 | B1 | * | 6/2003 | Komatsuzaki | G11C 7/06 365/117 |
| 6,586,987 | B2 | * | 7/2003 | Somerville | G05F 3/265 323/316 |
| 7,193,447 | B1 | * | 3/2007 | Liu | G11C 7/065 327/55 |

(Continued)

*Primary Examiner* — Michael T Tran
(74) *Attorney, Agent, or Firm* — Holland & Hart LLP

(57) ABSTRACT

Methods, systems, and devices for a source follower-based sensing architecture and sensing scheme are described. In one example, a memory device may include a sense circuit that includes two source followers that are coupled to each other and to a sense amplifier. A method of operating the memory device may include transferring a digit line voltage to one of the source followers and transferring a reference voltage to the other source follower. After transferring the digit line voltage and the reference voltage, the source followers may be enabled so that signals representative of the digit line voltage and the reference voltage are transferred from the outputs of the source followers to the sense amplifier for sensing.

19 Claims, 14 Drawing Sheets

(56) References Cited

U.S. PATENT DOCUMENTS

| | | | |
|---|---|---|---|
| 7,881,119 B2* | 2/2011 | Fukushima | G05F 3/262 365/185.21 |
| 8,975,776 B2* | 3/2015 | Gunther | G05F 1/56 307/31 |
| 9,245,597 B2* | 1/2016 | Guo | G11C 7/062 |
| 9,368,178 B2* | 6/2016 | Kim | G11C 11/1673 |
| 10,199,112 B1* | 2/2019 | Tran | G11C 16/28 |
| 2003/0015999 A1* | 1/2003 | Corva | G05F 1/466 323/273 |
| 2005/0117411 A1* | 6/2005 | Koshikawa | G11C 7/12 365/189.09 |
| 2005/0264347 A1* | 12/2005 | Gyohten | G05F 1/465 327/540 |
| 2006/0202668 A1* | 9/2006 | Tran | G11C 5/145 323/215 |
| 2007/0008206 A1* | 1/2007 | Tooyama | H03M 1/0607 341/155 |
| 2007/0036008 A1* | 2/2007 | Park | G11C 11/4096 365/189.09 |
| 2007/0177442 A1* | 8/2007 | Tomishima | G11C 7/062 365/207 |
| 2008/0002481 A1* | 1/2008 | Gogl | G11C 5/02 365/189.06 |
| 2008/0019192 A1* | 1/2008 | Wang | G11C 7/062 365/189.06 |
| 2008/0055960 A1* | 3/2008 | Morita | G11C 11/22 365/145 |
| 2009/0010081 A1* | 1/2009 | Hirobe | G11C 7/1078 365/189.16 |
| 2009/0045876 A1* | 2/2009 | Wang | H03F 1/26 330/258 |
| 2009/0251188 A1* | 10/2009 | Kim | H02M 3/073 327/291 |
| 2011/0069554 A1* | 3/2011 | Lo Giudice | G11C 7/02 365/185.21 |
| 2011/0199812 A1* | 8/2011 | Kitagawa | G11C 7/1048 365/148 |
| 2011/0225355 A1* | 9/2011 | Kajigaya | G11C 11/406 711/106 |
| 2013/0070506 A1* | 3/2013 | Kajigaya | G11C 7/18 365/51 |
| 2013/0163303 A1* | 6/2013 | Egawa | G11C 5/063 365/63 |
| 2013/0272060 A1* | 10/2013 | Andre | G11C 11/1673 365/158 |
| 2015/0269978 A1* | 9/2015 | Jung | G11C 7/062 365/96 |
| 2015/0294710 A1* | 10/2015 | Onuki | G11C 7/1069 365/149 |
| 2017/0339361 A1* | 11/2017 | Gancarz | G01S 17/89 |
| 2018/0061486 A1* | 3/2018 | Itoh | G11C 11/417 |
| 2019/0355397 A1* | 11/2019 | Ishizu | G06F 12/00 |
| 2019/0371370 A1* | 12/2019 | Hanyu | G11C 16/26 |

* cited by examiner

SOURCE FOLLOWER-BASED SENSING SCHEME

BACKGROUND

The following relates generally to memory systems and more specifically to a source follower-based sensing scheme.

Memory devices are widely used to store information in various electronic devices such as computers, wireless communication devices, cameras, digital displays, and the like. Information is stored by programming different states of a memory device. For example, binary memory devices have two logic states, often denoted by a logic "1" or a logic "0". In other memory devices, more than two logic states may be stored. To access the stored information, a component of the electronic device may read, or sense, the stored logic state in the memory device. To store information, a component of the electronic device may write, or program, the logic state in the memory device.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source.

A device may determine the logic states stored in memory by comparing the signals output by memory cells with a reference signal. For example, a sense amplifier may be used to sense the difference between a voltage of the memory cell and a reference voltage. But the circuit that provides the memory cell voltage and the reference voltage to the sense amplifier may introduce delay into the sensing scheme (e.g., by providing the voltages serially) and may consume excess power (e.g., by requiring an external bias current). Thus, the circuit may increase the latency and power consumption associated with sensing, which may negatively impact the device's performance, among other disadvantages.

DETAILED DESCRIPTION

Figure 1:
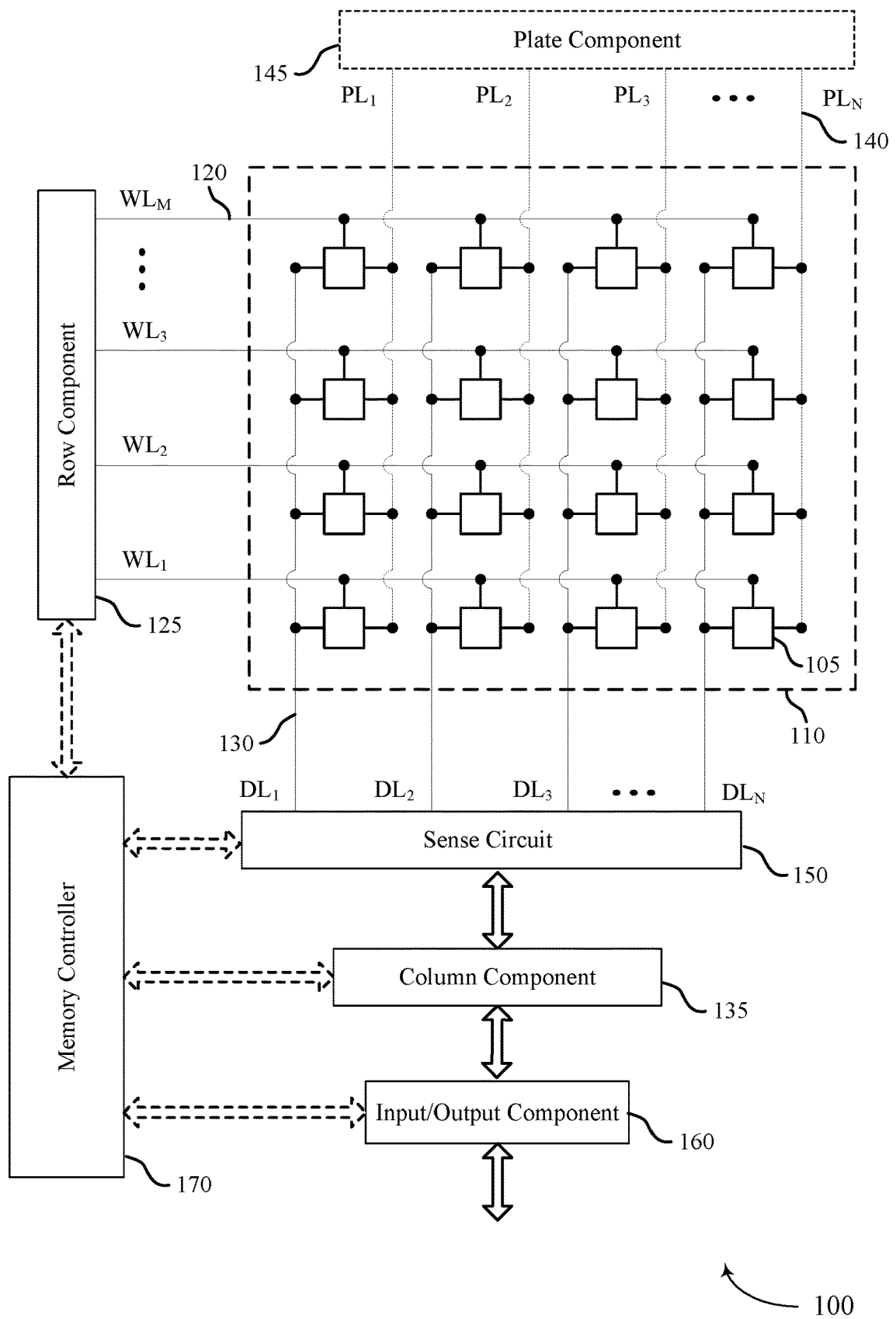
FIG. 1 illustrates an example memory device that supports a source follower-based sensing scheme in accordance with examples of the present disclosure.

A device may determine the logic states stored in memory by comparing the signals output by memory cells to a reference signal, but the circuit that provides the memory cell voltage and the reference voltage to a sense component may introduce delay into the sensing scheme and may consume excess power. This may negatively impact the device's performance. A device may reduce sensing latency and power consumption by concurrently loading the voltages needed for sensing via a circuit that is self-biasing. The circuit may, in some examples, include two source-followers that are configured in a manner that permits them to be loaded concurrently or simultaneously (e.g., one source follower may be loaded with a reference voltage while the other is loaded with a voltage that represents the logic state of a memory cell). The circuit may also include supporting circuitry that builds and/or boosts the voltage to be sensed and in some cases does so without the assistance of an external bias current.

In general, the logic state of a memory cell may be sensed by comparing the voltage it outputs to a reference voltage. These voltages (e.g., those involved in the sensing operation) may be referred to herein as sensing voltages. Because storage of a logic '1' results in a higher output voltage than storage of a logic '0,' (or vice versa in some memory architectures) the logic state of a memory cell can be determined based on whether its output voltage is higher or lower than a reference voltage. The comparison of the memory cell voltage to the reference voltage may be performed by a sense component, such as a sense amplifier, within a sense circuit.

In some sense circuits, sensing voltages are loaded into (e.g., developed at) a buffer circuit before they are provided to or transmitted to the sense component for comparison. Due to the configuration of the buffer circuit, the sensing voltages may be loaded one at a time. For example, the reference voltage may be loaded first followed by the voltage from the memory cell. Such serial-loading may be complex to control, and it may delay activating the sense amplifier, which may increase the latency of the sense operation.

According to the techniques described herein, the complexity and latency of a sensing operation may be reduced by using techniques to load the sensing voltages at the same time (or nearly the same time). For example, the sensing voltages may be loaded concurrently (e.g., in parallel) by developing the reference voltage at a first source follower at the same time (or nearly the same time) the memory cell voltage is developed at a second source follower. Once the sensing voltages are developed (e.g., have reached a state of equilibrium), the sensing voltages may be transferred to the sense component (e.g., a sense amplifier) for comparison by activating switches (e.g., transistors) that isolate the source followers from the sense amplifier.

The source followers may be coupled with a variety of other components, different configurations of which may provide distinct advantages. For example, although in some cases a single switch may be used to control the flow of charge between each source follower and the sense amplifier, the simplicity offered by such a scheme may be offset by the analog control signals used for each switch. This is because digital control signals are generally easier to generate (and use) than analog control signals in certain applications. So to enable digital control signaling, in some examples a pair of switches in a diode configuration may be used to control the flow of charge between each source follower and the sense amplifier. In another example, the addition of a switch along the signal path from the memory cell to one of the source followers may increase the sense window (e.g., the difference between the voltages resulting from a logic "1" and a logic "0").

Features of the disclosure introduced above are further described with reference to FIGS. 1 through 3 in the context of memory arrays, memory circuits, and memory cell behaviors that support a source follower-based sensing scheme. Specific examples are then described with reference to FIGS. 4 through 9, which illustrate a particular circuit with associated timing diagrams that support a source follower-based sensing architecture. These and other features of the disclosure are further described with respect to FIGS. 10 and 14, which illustrate apparatus diagrams, system diagrams, and flowcharts that support source follower-based sensing schemes.

FIG. 1 illustrates an example memory device 100 that supports a source follower-based sensing scheme in accordance with various examples of the present disclosure. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. In some examples, the memory cells 105 may include a capacitive memory element, a ferroelectric memory element, a resistive element, a self-selecting memory element, or a combination thereof. The set of memory cells 105 may be part of a memory array 110 of the memory device 100 (e.g., an array of memory cells 105).

In some examples, a memory cell 105 may store an electric charge representative of the programmable logic states (e.g., storing charge in a capacitor). In one example, a charged and uncharged capacitor may represent two logic states, respectively. In another example, a positively charged and negatively charged capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states (e.g., supporting more than two logic states in a respective memory cell 105). In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail with reference to FIG. 3.

In some examples, a memory cell 105 may include a material portion, which may be referred to as a memory element, a memory storage element, a self-selecting memory element, or a self-selecting memory storage element. The material portion may have a variable and configurable electrical resistance that is representative of different logic states.

For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, a collection of a relatively large crystal grains that may be substantially crystalline) may have a relatively low electrical resistance, and may alternatively be referred to as a "SET" logic state. A more-amorphous state of the material (e.g., an entirely amorphous state, some distribution of relatively small crystal grains that may be substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105. Although described with reference to sensing voltages, the source-based sensing techniques described herein may be implemented for sensing currents.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage. In some examples, electrical current may flow through a memory element in the more-amorphous state when a voltage greater than the threshold voltage is applied across the memory element. In some examples, electrical current may not flow through a memory element in the more-amorphous state when a voltage less than the threshold voltage is applied across the memory element. In some cases, a memory element in a more-crystalline state may not be associated with a threshold voltage (e.g., may be associated with a threshold voltage of zero). In some examples, electrical current may flow through a memory element in the more-crystalline state in response to a non-zero voltage across the memory element.

In some cases, a material in both the more-amorphous state and the more-crystalline state may be associated with threshold voltages. For example, self-selecting memory may enhance differences in a threshold voltage of a memory cell between different programmed states (e.g., by way of different compositional distributions). The logic state of a memory cell 105 having such a memory element may be set by heating the memory element to a temperature profile over time that supports forming a particular atomic configuration, or combination of atomic configurations.

A memory device 100 may include a three-dimensional (3D) memory array, where multiple two-dimensional (2D) memory arrays (e.g., decks, levels) are formed on top of one another. Such an arrangement may increase the number of memory cells 105 that may be placed or created on a single die or substrate as compared with 2D arrays, which in turn may reduce production costs or increase the performance of a memory device 100, or both. The decks may be separated by an electrically insulating material. Each deck or level may be aligned or positioned so that memory cells 105 may be approximately aligned with one another across each deck, forming a stack of memory cells 105.

In the example of memory device 100, each row of memory cells 105 may be coupled with one of a plurality of first access lines 120 (e.g., a word line (WL), such as one of $WL_1$ through $WL_M$), and each column of memory cells 105 may be coupled with one of a plurality of second access lines 130 (e.g., a digit line (DL), such as one of $DL_1$ through $DL_N$). In some cases, first access lines 120 and second access lines 130 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) an access line 120 and an access line 130. This intersection may be referred to as an address of a memory cell 105. A target or selected memory cell 105 may be a memory cell 105 located at the intersection of an energized or otherwise selected access line 120 and an energized or otherwise selected access line 130. In other words, an access line 120 and an access line 130 may be energized or otherwise selected to access (e.g., read, write, rewrite, refresh) a memory cell 105 at their intersection. Other memory cells 105 that are in electronic communication with (e.g., connected to) the same access line 120 or 130 may be referred to as untargeted or non-selected memory cells 105.

In some architectures, the logic storing component (e.g., a capacitive memory element, a ferroelectric memory element, a resistive memory element, other memory element) of a memory cell 105 may be electrically isolated from a second access line 130 by a cell selection component. A first access line 120 may be coupled with the cell selection component (e.g., via a control node or terminal of the cell selection component), and may control the cell selection component of the memory cell 105. For example, the cell selection component may be a transistor and the first access line 120 may be coupled with a gate of the transistor (e.g., where a gate node of the transistor may be a control node of the transistor). Activating the first access line 120 of a memory cell 105 may result in an electrical connection or closed circuit between the logic storing component of the memory cell 105 and its corresponding second access line 130. The second access line 130 may then be accessed to read or write the memory cell 105.

In some examples, memory cells 105 may also be coupled with one of a plurality of third access lines 140 (e.g., a plate line (PL), such as one of $PL_1$ through $PL_N$). In some examples, the plurality of third access lines 140 may couple memory cells 105 with one or more voltage sources for various sensing and/or writing operations including those described herein. For example, when a memory cell 105 employs a capacitor for storing a logic state, a second access line 130 may provide access to a first terminal or a first plate of the capacitor, and a third access line 140 may provide access to a second terminal or a second plate of the capacitor (e.g., a terminal associated with an opposite plate of the capacitor as opposed to the first terminal of the capacitor, a terminal otherwise on the opposite side of a capacitance from the first terminal of the capacitor).

The plurality of third access lines 140 may be coupled with a plate component 145, which may control various operations such as activating one or more of the plurality of third access lines 140, or selectively coupling one or more of the plurality of third access lines 140 with a voltage source or other circuit element. Although the plurality of third access lines 140 of the memory device 100 are shown as substantially parallel with the plurality of second access lines 130, in other examples, a plurality of third access lines 140 may be substantially parallel with the plurality of first access lines 120, or in any other configuration.

Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 120, or with (e.g., between) a memory cell 105 and an access line 130. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

Access operations such as reading, writing, rewriting, and refreshing may be performed on a memory cell 105 by activating or selecting a first access line 120, a second access line 130, and/or a third access line 140 coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal may be used to determine the logic state stored by the memory cell 105. For example, a memory cell 105 with a capacitive memory element storing a logic state may be selected, and the resulting flow of charge via an access line and/or resulting voltage of an access line may be detected to determine the programmed logic state stored by the memory cell 105.

Accessing memory cells 105 may be controlled through a row component 125 (e.g., a row decoder), a column component 135 (e.g., a column decoder), or a plate component 145 (e.g., a plate driver). For example, a row component 125 may receive a row address from the memory controller 170 and activate the appropriate first access line 120 based on the received row address. Similarly, a column component 135 may receive a column address from the memory controller 170 and activate the appropriate second access line 130. Thus, in some examples, a memory cell 105 may be accessed by activating a first access line 120 and a second access line 130. In some examples, such access operations may be accompanied by a plate component 145 biasing one or more of the third access lines 140, which may be referred to as "moving the plate" of memory cells 105 or the memory array.

In some examples, the memory controller 170 may control the operation (e.g., read operations, write operations, rewrite operations, refresh operations, discharge operations, dissipation operations, equalization operations) of memory cells 105 through the various components (e.g. row component 125, column component 135, plate component 145, sense circuit 150). In some cases, one or more of the row component 125, the column component 135, the plate component 145, and the sense circuit 150 may be co-located or otherwise included with the memory controller 170. The memory controller 170 may generate row and column address signals to activate a desired access line 120 and access line 130. The memory controller 170 may also generate or control various voltages or currents used during the operation of memory device 100. For example, the memory controller 170 may apply a discharge or equalization voltage to one or more of an access line 120, an access line 130, or an access line 140 after accessing one or more memory cells 105.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state.

A memory cell 105 may be read (e.g., sensed) by a sense circuit 150 when the memory cell 105 is accessed (e.g., in cooperation with the memory controller 170) to determine a logic state stored by the memory cell 105. For example, the sense circuit 150 may be configured to sense a current or charge through the memory cell 105, or a voltage resulting from coupling the memory cell 105 with the sense circuit 150 or other intervening component (e.g., a signal development component between the memory cell 105 and the sense circuit 150), responsive to a read operation. For example, the sense circuit 150 may detect the logic state of a memory cell 105 by comparing the voltage output by the memory cell 105 to a reference voltage. The voltages compared by the sense circuit 150 may be referred to herein as the sensing voltages. After comparing the sensing voltages, the sense circuit 150 may provide (e.g., transmit or transfer) an output signal indicative of the logic state stored by the memory cell 105 to one or more components (e.g., to the column component 135, the input/output component 160, the memory controller 170).

As described herein, a sense circuit 150 may include circuitry that allows parallel loading of the sensing signals (e.g., sensing currents or voltages). The loading may occur at an intermediate state of the sensing operation (e.g., before the sensing voltages are provided to the sense amplifier that performs the comparison). For instance, the sense circuit 150 may develop the sensing signals at the outputs of two source followers. Once the sensing signals have been developed (e.g., have reached an equilibrium state), or after a threshold amount of time has elapsed, the sense circuit 150 may pass signals to its sense amplifier for comparison.

In some examples, during or after accessing the memory cell 105, the logic storage portion of memory cell 105 may discharge, or otherwise permit electrical charge or current to flow via its corresponding access lines 120, 130, or 140. Such charge or current may result from biasing, or applying a voltage, to the memory cell 105 from one or more voltage sources or supplies (not shown) of the memory device 100, where such voltage sources or supplies may be part of the row component 125, the column component 135, the plate component 145, the sense circuit 150, the memory controller 170, or some other component (e.g., a biasing component). In some examples, a discharge of a memory cell 105 may cause a change in the voltage of the access line 130, which the sense circuit 150 may compare to a reference voltage to determine the stored state of the memory cell 105. In some examples, a voltage may be applied to a memory cell 105 (e.g., using the corresponding access line 120 and access line 130) and the presence of a resulting current may depend on the applied voltage and the resistance state of a memory element of the memory cell 105, which the sense circuit 150 may use to determine the stored state of the memory cell 105

In some examples, when a read signal (e.g., a read pulse, a read current, a read voltage) is applied across a memory cell 105 with a memory element storing a first logic state (e.g., a SET state, associated with a more-crystalline atomic configuration), the memory cell 105 conducts current due to the read pulse exceeding a threshold voltage of the memory cell 105. In response or based on this, the sense circuit 150 may therefore detect a current through the memory cell 105 as part of determining the logic state stored by the memory cell 105. When a read pulse is applied to the memory cell 105 with the memory element storing a second logic state (e.g., a RESET state, associated with a more-amorphous atomic configuration), which may occur before or after the application of a read pulse across a memory cell 105 with a memory element storing a first logic state, the memory cell 105 may not conduct current due to the read pulse not exceeding the threshold voltage of the memory cell 105. The sense circuit 150 may therefore detect little or no current through the memory cell 105 as part of determining the stored logic state.

In some examples, a threshold current may be defined for sensing the logic state stored by a memory cell 105. For example, the threshold current may be higher than a leakage current of the associated access lines 120, 130, or 140. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied as part of a read operation). For example, if an applied read voltage does not result in current flow, one or more other read voltages may be applied (e.g., until a current is detected by sense circuit 150). Based on assessing the read voltage that resulted in current flow, the stored logic state of the memory cell 105 may be determined. In some cases, a read voltage may be ramped (e.g., smoothly increasing higher in magnitude) until a current flow or other condition is detected by a sense circuit 150. In other cases, predetermined read voltages may be applied (e.g., a predetermined sequence of read voltages that increase higher in magnitude in a stepwise manner) until a current is detected. Likewise, a read current may be applied to a memory cell 105 and the magnitude of the voltage to create the read current may depend on the electrical resistance or the total threshold voltage of the memory cell 105.

A sense circuit 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense circuit 150 may include a collection of components (e.g., circuit elements) that are repeated for each of a set of access lines 130 connected to the sense circuit 150. For example, a sense circuit 150 may include a separate sense circuit (e.g., a separate sense amplifier, a separate signal development component) for each of a set of access lines 130 coupled with the sense circuit 150, such that a logic state may be separately detected for a respective memory cell 105 coupled with a respective one of the set of access lines 130. In some examples, a reference signal source (e.g., a reference component or reference voltage source) or generated reference signal may be shared between components of the memory device 100 (e.g., shared among one or more sense circuits 150, shared among separate sense circuits of a sense circuit 150).

The sense circuit 150 may be included in a device that includes the memory device 100. For example, the sense circuit 150 may be included with other read and write circuits, decoding circuits, or register circuits of the memory that may be coupled to the memory device 100. In some examples, the detected logic state of a memory cell 105 may be output through a column component 135 as an output. In some examples, a sense circuit 150 may be part of a column component 135 or a row component 125. In some examples, a sense circuit 150 may be connected to or otherwise in electronic communication with a column component 135 or a row component 125.

Although a single sense circuit 150 is shown, a memory device 100 may include more than one sense circuit 150. For example a first sense circuit 150 may be coupled with a first subset of access lines 130 and a second sense circuit 150 may be coupled with a second subset of access lines 130 (e.g., different from the first subset of access lines 130). In some examples, such a division of sense circuits 150 may support parallel (e.g., simultaneous) operation of multiple sense circuits 150. In some examples, such a division of sense circuits 150 may support matching sense circuits 150 having different configurations or characteristics to particular subsets of the memory cells 105 of the memory device (e.g., supporting different types of memory cells 105, supporting different characteristics of subsets of memory cells 105, supporting different characteristics of subsets of access lines 130). Additionally or alternatively, two or more sense circuits 150 may be coupled with a same set of access lines 130 (e.g., for component redundancy). In some examples, such a configuration may support maintaining functionality to overcome a failure or otherwise poor operation of one of the redundant sense circuits 150. In some examples, such a configuration may support the ability to select one of the redundant sense circuits 150 for particular operational characteristics (e.g., as related to power consumption characteristics, as related to access speed characteristics for a particular sensing operation, as related to operating memory cells 105 in a volatile mode or a non-volatile mode).

In some memory architectures, accessing the memory cell 105 may degrade or destroy the stored logic state and rewrite or refresh operations may be performed to return the original logic state to memory cell 105. In DRAM or FeRAM, for example, a capacitor of a memory cell 105 may be partially or completely discharged during a sense operation, thereby corrupting the logic state that was stored in the memory cell 105. In PCM, for example, sense operations may cause a change in the atomic configuration of a memory cell 105, thereby changing the resistance state of the memory cell 105. Thus, in some examples, the logic state stored in a memory cell 105 may be rewritten after an access operation. Further, activating a single access line 120, 130, or 140 may result in the discharge of all memory cells 105 coupled with the activated access line 120, 130, or 140. Thus, several or all memory cells 105 coupled with an access line 120, 130, or 140 associated with an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write, refresh, or equalization pulse or bias to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 120, second access line 130, and/or third access line 140. In other words, a logic state may be stored in the memory cell 105. Row component 125, column component 135, or plate component 145 may accept data, for example, via input/output component 160, to be written to the memory cells 105. In some examples, a write operation may be performed at least in part by a sense circuit 150, or a write operation may be configured to bypass a sense circuit 150.

In the case of a capacitive memory element, a memory cell 105 may be written by applying a voltage to the capacitor, and then isolating the capacitor (e.g., isolating the capacitor from a voltage source used to write the memory cell 105) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage may be applied across the ferroelectric memory element (e.g., grounding, virtually grounding, or equalizing a voltage across the ferroelectric memory element). In the case of PCM, a memory element may be written by applying a current with a profile that causes (e.g., by way of heating and cooling) the memory element to form an atomic configuration associated with a desired logic state.

In some examples in accordance with the present disclosure, the memory device 100 may include a set of memory cells 105 coupled with or between a second access line 130 and a third access line 140. Each of the memory cells 105 may include a cell selection component configured to selectively couple the respective one of the memory cells 105 with the second access line 130 or the third access line 140. In some examples, each of the cell selection components may be coupled (e.g., at a control node or a control terminal of the respective cell selection component) with a respective one of the first access lines 120, which may be used to activate or deactivate the particular cell selection component.

An access operation, which may include a read operation, a write operation, a rewrite operation, a refresh operation, or a combination thereof, may be performed on a selected one of the memory cells 105. In some examples, the access operation may be associated with biasing the associated second access line 130 or the associated third access line 140. During the access operation, the cell selection component for the selected memory cell 105 may be activated, such that the selected memory cell 105 may be selectively coupled with the second access line 130 and the third access line 140. Thus, a signal associated with the access operation (e.g., a voltage associated with the access operation, a charge associated with the access operation, a current associated with the access operation) may pass to, from, or through the selected memory cell 105 as a result of the biasing of the second access line 130 or the third access line 140 for the access operation.

Although the cell selection components of non-selected memory cells 105 may be deactivated, leakage charge may flow through a deactivated cell selection components. For example, when the associated second access line 130 or third access line 140 is biased at a voltage associated with the access operation on the selected memory cell 105, a difference in voltage between a non-selected memory cell 105 and the second access line 130 or the third access line 140 may cause leakage charge to flow across the deactivated cell selection component to or from the non-selected memory cell 105 (e.g., during the access operation on the selected memory cell). Such a leakage charge may accumulate on non-selected memory cells 105 in successive access operations, or may cause a non-zero bias or voltage to accumulate at the non-selected memory cell. In some examples, such an accumulation of leakage charge or bias may cause a loss of data stored in the non-selected memory cells 105.

In accordance with examples of the present disclosure, operations may be performed after an access operation on a selected memory cell 105 to encourage or otherwise support the dissipation of accumulated leakage charge or bias from non-selected memory cells 105. For example, after an access operation on a selected memory cell 105, the cell selection component of one or more non-selected memory cells 105 may be activated (e.g., by activating a first access line 120 associated with one or more non-selected memory cells). While the cell selection components of non-selected memory cells 105 are activated, the associated second access line 130 and third access line 140 may be coupled with voltage sources that support the dissipation of accumulated leakage charge or voltage bias. For example, the second access line 130 and the third access line 140 may be coupled with a same voltage source, or coupled with voltage sources having the same voltage, or coupled with voltage sources having voltages that otherwise support the dissipation of leakage charge or bias accumulated at non-selected memory cells 105.

In some examples, the described operations associated with such a dissipation of leakage charge or bias may be referred to as a dissipation operation or an equalization operation. By performing the dissipation or equalization operations described herein, leakage charge or voltage bias accumulated at a non-selected memory cell 105 may be dissipated after an access operation on a selected memory cell 105, which may mitigate or prevent the accumulation of leakage charge across successive access operations and improve the ability of the memory device 100 to maintain stored data.

Figure 2:
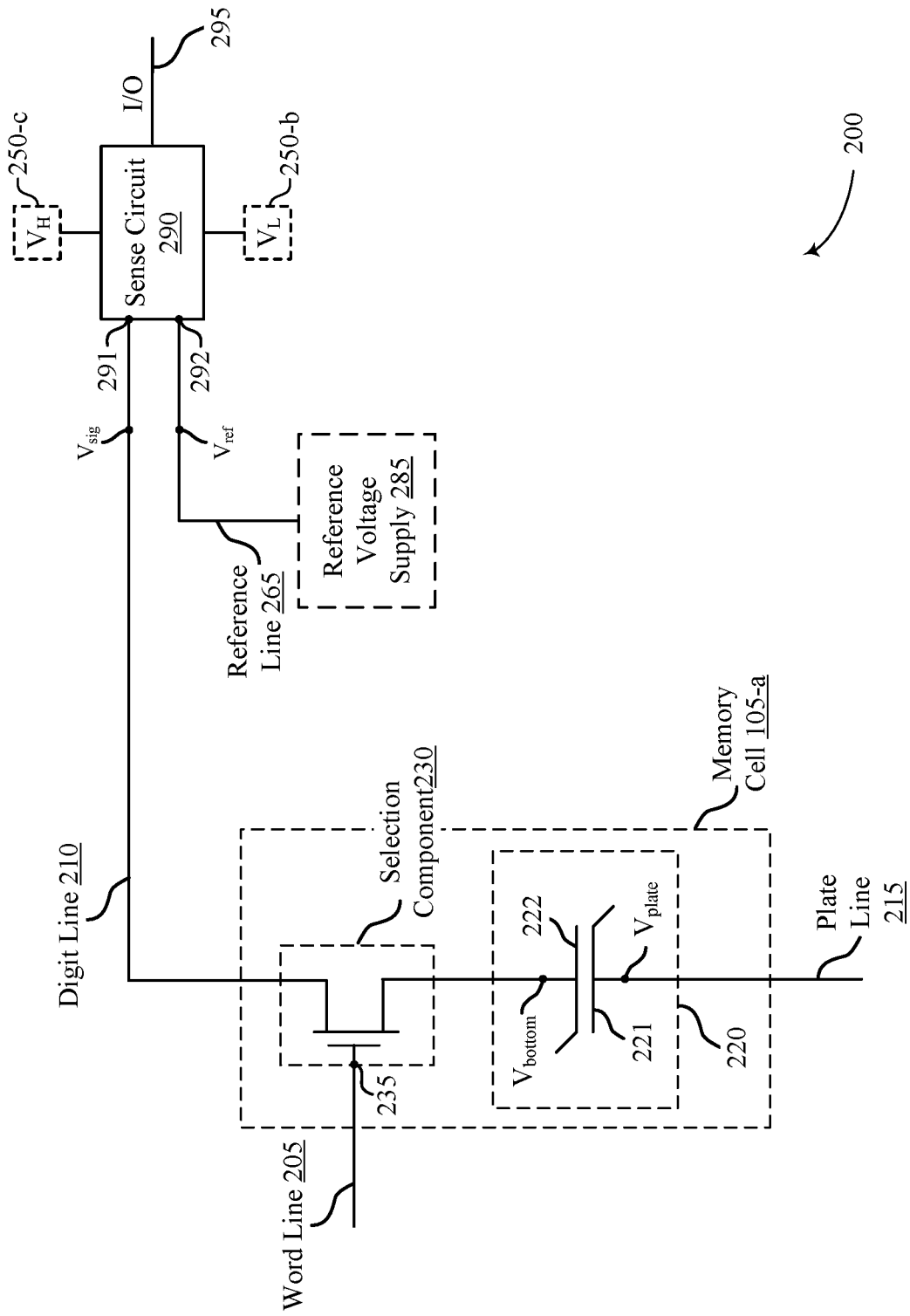
FIG. 2 illustrates an example circuit that supports a source follower-based sensing scheme in accordance with examples of the present disclosure.

FIG. 2 illustrates an example circuit 200 that supports a source follower-based sensing scheme in accordance with various examples of the present disclosure. Circuit 200 may include a memory cell 105-a, which may be an example of a memory cell 105 described with reference to FIG. 1. Circuit 200 may also include a sense circuit 290, which may be an example of, or a portion of, a sense circuit 150 described with reference to FIG. 1. Circuit 200 may also include a word line 205, a digit line 210, and a plate line 215. The circuit 200 may also include a reference line 265, which may be used to transfer a reference voltage from reference voltage supply 285 to sense circuit 290.

As illustrated in FIG. 2, the sense circuit 290 may include a first node 291 and a second node 292 which, in some examples, may be coupled with different access lines of the circuit 200 (e.g., digit line 210 and reference line 265, respectively). However, other configurations of access lines and/or reference lines are possible in accordance with various examples of the present disclosure.

Memory cell 105-a may include a logic storage component (e.g., a memory element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The orientation of cell plate 221 and cell bottom 222 may be different (e.g., flipped) without changing the operation of the memory cell 105-a. The cell plate 221 may be accessed via the plate line 215 and cell bottom 222 may be accessed via the digit line 210. As described herein, various logic states may be stored by charging, discharging, and/or polarizing the capacitor 220.

The capacitor 220 may be in electronic communication with the digit line 210, and the stored logic state of the capacitor 220 may be read or sensed by operating various elements represented in circuit 200. For example, the memory cell 105-a may also include a cell selection component 230 which, in some examples, may be referred to as a switching component coupled with an access line (e.g., the digit line 210) and the capacitor 220. In some examples, a cell selection component 230 may be considered to be outside the illustrative boundary of the memory cell 105-a, and the cell selection component may be referred to as a switching component coupled with an access line (e.g., the digit line 210) and the memory cell 105-a.

The capacitor 220 may be selectively coupled with the digit line 210 when cell selection component 230 is activated (e.g., by way of an activating logical signal), and the capacitor 220 can be selectively isolated from digit line 210 when cell selection component 230 is deactivated (e.g., by way of a deactivating logical signal). A logical signal or other selection signal or voltage may be applied to a control node 235 (e.g., a control node, a control terminal, a selection node, a selection terminal, a gate node) of the cell selection component 230 (e.g., via the word line 205). In other words, the cell selection component 230 may be configured to selectively couple or decouple the capacitor 220 and the digit line 210 based on a logical signal or voltage applied via the word line 205 to the control node 235.

Activating the cell selection component 230 may be referred to as selecting the memory cell 105-a in some examples, and deactivating the cell selection component 230 may be referred to as deselecting the memory cell 105-a in some examples. In some examples, the cell selection component 230 is a transistor and its operation may be controlled by applying an activation voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor. The word line 205 may be used to activate the cell selection component 230. For example, a selection voltage applied to the word line 205 (e.g., a word line logical signal or a word line voltage) may be applied to the gate of a transistor of cell selection component 230, which may selectively connect the capacitor 220 with the digit line 210 (e.g., providing a conductive path between the capacitor 220 and the digit line 210).

In other examples, the positions of the cell selection component 230 and the capacitor 220 in the memory cell 105-a may be switched, such that cell selection component 230 may be coupled with or between the plate line 215 and the cell plate 221, and the capacitor 220 may be coupled with or between the digit line 210 and the other terminal of the cell selection component 230. In such an example, the cell selection component 230 may remain in electronic communication with the digit line 210 through the capacitor 220. This configuration may be associated with alternative timing and biasing for access operations.

Operation of the memory cell 105-a by varying the voltage to cell plate 221 (e.g., via the plate line 215) may be referred to as "moving the cell plate." Biasing the plate line 215 and/or the digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of the capacitor 220 (e.g., whether the initial logic state stored a logic 1 or a logic 0). In some schemes, the change in the stored charge of the capacitor 220 may cause a change in the voltage of the digit line 210, which may be used by the sense circuit 290 to determine the stored logic state of the memory cell 105-a. For example, the sense circuit 290 may compare the voltage on the digit line 210 (e.g., the voltage output by the memory cell 105-a) to a reference voltage supplied by reference voltage supply 285 to determine the logic state that was stored in the memory cell 105-a. The sense circuit 290 may include various transistors or amplifiers to detect, convert, or amplify a difference in signals, which may be referred to as latching. For example, the sense circuit 290 may include circuit elements that receive and compare a sense signal voltage (e.g., $V_{sig}$) at the first node 291 with a reference signal voltage (e.g., $V_{ref}$) at the second node 292. An output of the sense amplifier may be driven to a higher (e.g., a positive) or a lower voltage (e.g., a negative voltage, a ground voltage) based on the comparison at the sense circuit 290.

For example, if the first node 291 has a lower voltage than the second node 292, the output of the sense circuit 290 may be driven to a relatively lower voltage of a first sense component voltage source 250-b (e.g., a voltage of $V_L$, which may be a ground voltage substantially equal to $V_0$ or a negative voltage). A sense circuit 150 that includes the sense circuit 290 may latch the output of the sense circuit 290 to determine the logic state stored in the memory cell 105-a (e.g., detecting a logic 0 when the first node 291 has a lower voltage than the second node 292).

If the first node 291 has a higher voltage than the second node 292, the output of the sense circuit 290 may be driven to the voltage of a second sense component voltage source 250-c (e.g., a voltage of $V_H$). A sense circuit 150 that includes the sense circuit 290 may latch the output of the sense circuit 290 to determine the logic state stored in the memory cell 105-a (e.g., detecting a logic 1 when the first node 291 has a higher voltage than the second node 292). The latched output of the sense circuit 290, corresponding to the detected logic state of memory cell 105-a, may then be output via one or more input/output (I/O) lines (e.g., I/O line 295), which may include an output through a column component 135 via input/output component 160 described with reference to FIG. 1.

According to the techniques described herein, the voltages compared by the sense circuit 290 (e.g., $V_{sig}$ and $V_{ref}$) may be provided to the sense circuit at the time, or nearly the same time (e.g., provision of $V_{sig}$ may overlap in time with provision of $V_{ref}$). For example, the sensing voltages may be concurrently or simultaneously provided to a buffer circuit within the sense circuit 290. Providing a signal may include developing a charge representative of the signal at a node, or transferring charge representative of the signal to a node. In some cases, a boosted (e.g., amplified) version of $V_{sig}$ may be provided to the buffer circuit. Once both sensing voltages are loaded (e.g., are fully developed such that they have reached an equilibrium) at the buffer circuit, the sense circuit 290 may pass them to a sense amplifier for comparison. The sense amplifier may be coupled to the sense circuit 290. In some cases, the sense amplifier is internal to the sense circuit 290; in others, the sense amplifier is external to the sense circuit 290.

To perform a write operation on the memory cell 105-a, a voltage may be applied across the capacitor 220. Various methods may be used. In one example, the cell selection component 230 may be activated through the word line 205 (e.g., by activating the word line 205) to electrically connect the capacitor 220 to the digit line 210. A voltage may be applied across capacitor 220 by controlling the voltage of the cell plate 221 (e.g., through the plate line 215) and the cell bottom 222 (e.g., through the digit line 210).

For example, to write a logic 0, the cell plate 221 may be taken high (e.g., applying a positive voltage to the plate line 215), and the cell bottom 222 may be taken low (e.g., grounding the digit line 210, virtually grounding the digit line 210, applying a negative voltage to the digit line 210). The opposite process may be performed to write a logic 1, where the cell plate 221 is taken low and the cell bottom 222 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the sense circuit 290 may be used to perform the write operations, which may include coupling the first sense component voltage source 250-*b* or the second sense component voltage source 250-*c* with the digit line. When the sense circuit 290 is used to perform the write operations, the signal development component 280 may or may not be bypassed (e.g., by applying a write signal via the bypass line 270).

The circuit 200, including the sense circuit 290, the cell selection component 230, or the reference voltage supply 285, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In some examples where a n-type transistor is employed as a switching component, the voltage of a logical signal applied to the gate terminal may be selected to operate the transistor at a particular working point (e.g., in a saturation region or in an active region).

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal). In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In some examples where a p-type transistor is employed as a switching component, the voltage of a logical signal applied to the gate terminal may be selected to operate the transistor at a particular working point (e.g., in a saturation region or in an active region).

Figure 3:
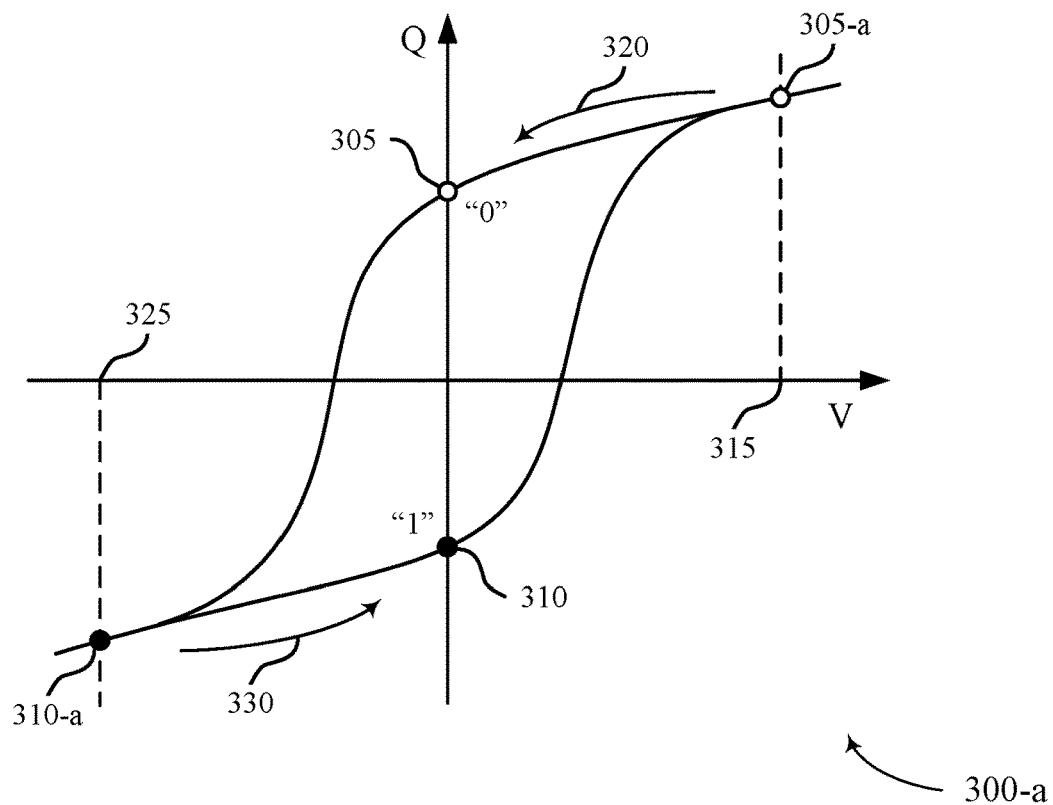
FIG. 3 illustrates an example of non-linear electrical properties with hysteresis plots for a memory cell that supports a source follower-based sensing scheme in accordance with examples of the present disclosure.
Figure 3:
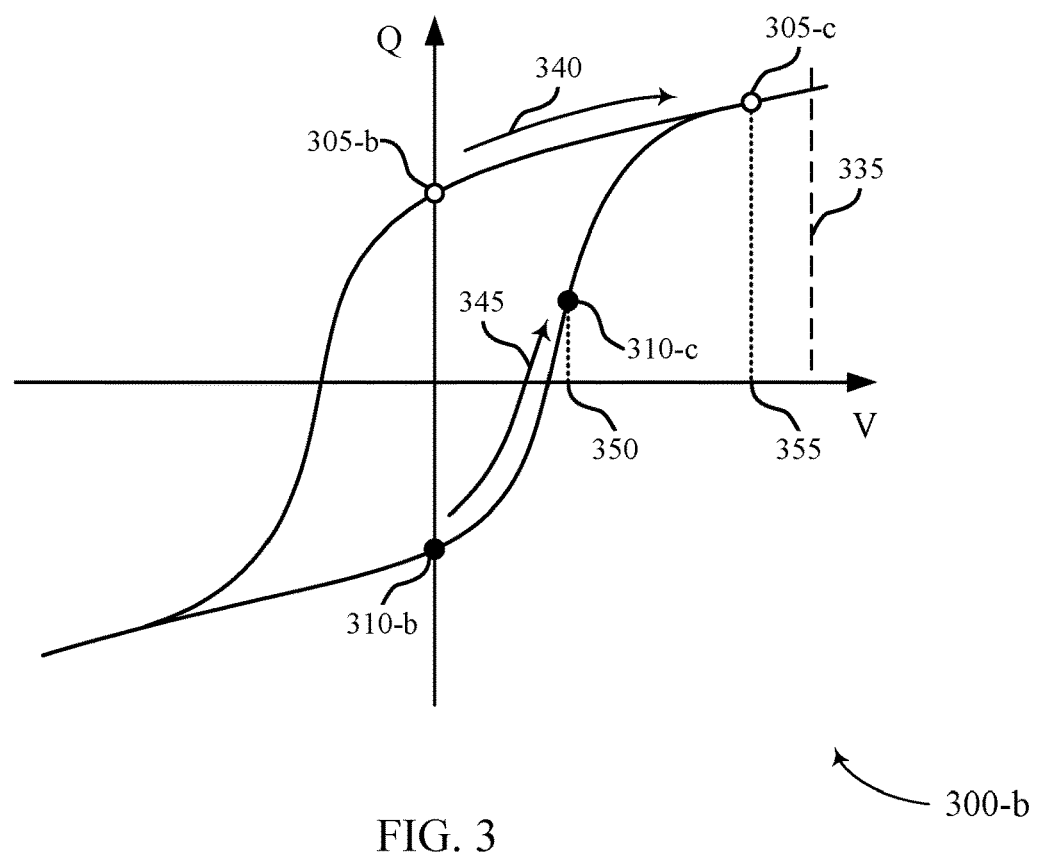

FIG. 3 illustrates an example of non-linear electrical properties with hysteresis curves 300-*a* and 300-*b* for a ferroelectric memory cell that supports a source follower-based sensing scheme in accordance with examples of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 220 of FIG. 2) as a function of a voltage difference, V.

A ferroelectric material is characterized by a spontaneous electric polarization, e.g., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)).

A negative voltage may be applied by maintaining the terminal in question at ground and applying a positive voltage to the second terminal—e.g., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, e.g., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor (e.g., by energizing the memory cell's plate line). In response, the stored charge, Q, changes, and the degree of the change depends on the initial charge state—e.g., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not be equal to voltage 335 and instead may depend on the voltage of the digit line. The position of final charge states 305-*c* and 310-*c* on hysteresis curve 300-*b* may thus depend on the capacitance of the digit line and may be determined through a load-line analysis—e.g., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—e.g., (voltage 335-voltage 350) or (voltage 335-voltage 355). The reference voltage may be generated such that its magnitude is between the two possible voltages of the two possible digit line voltages in order to determine the stored logic state—e.g., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (e.g., a logic 0 or 1) may be determined.

According to the techniques described herein, the reference voltage (or a signal representing the reference voltage) and the digit line voltage (or a signal representing the digit line voltage) may be concurrently or simultaneously passed to a sense amplifier for comparison. Such a scheme may, in some examples, be realized by using two source followers as described herein. Passing the reference voltage and the digit line voltage at the same time (or at overlapping times) may reduce the control complexity for the sensing operation, and may decrease its latency.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction.

Figure 4:
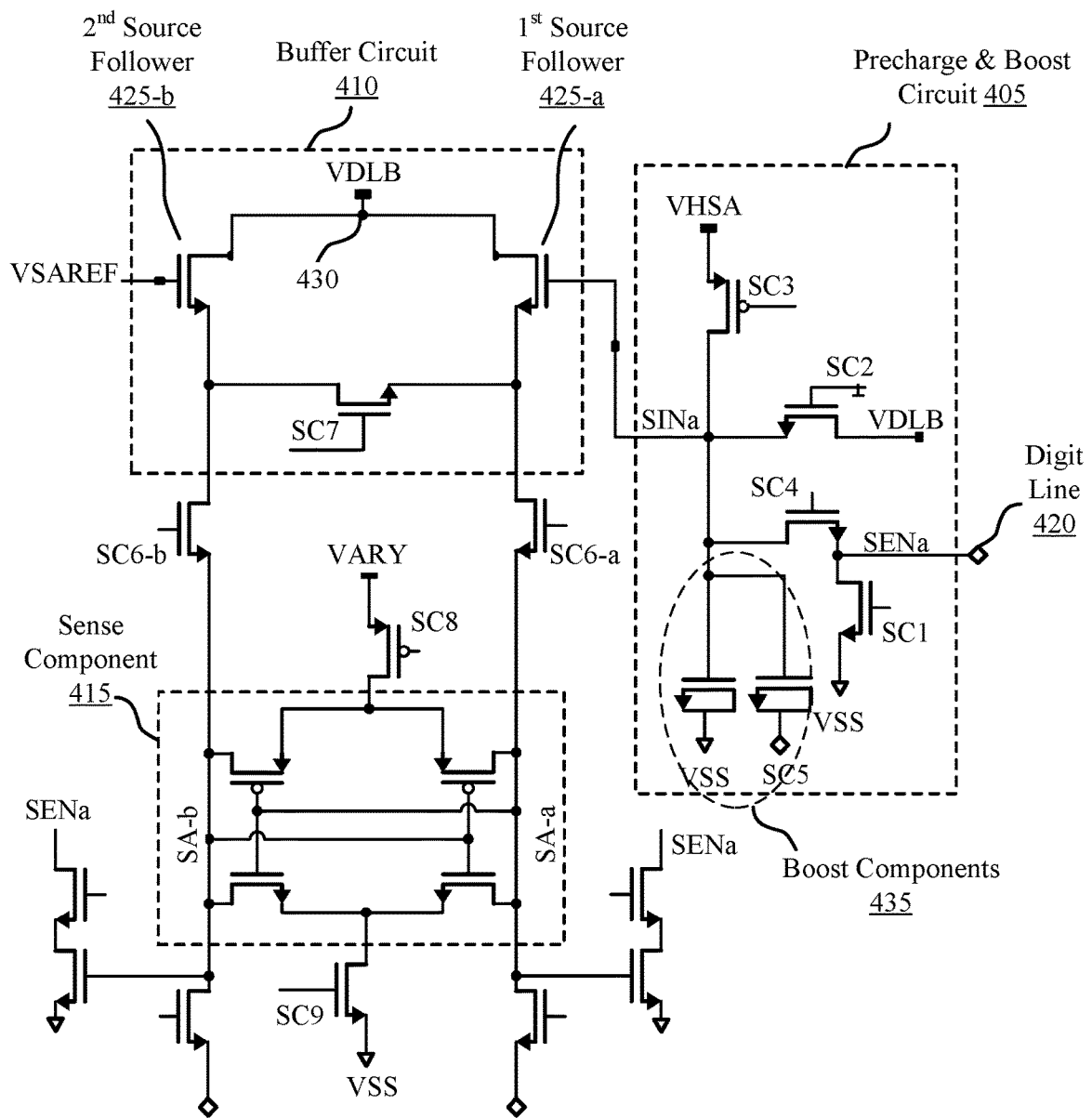
FIG. 4 illustrates an example of a sense circuit that supports a source follower-based sensing scheme in accordance with examples of the present disclosure.

FIG. 4 illustrates an example of a sense circuit 400 for a source follower-based sensing scheme in accordance with various examples of the present disclosure. Components of the circuit 400 may be examples of the corresponding components described with reference to FIGS. 1 through 3. Sense circuit 400 may include sub-circuits such as a precharge and boost circuit 405, a buffer circuit 410, and a sense component 415. These components may, in some cases, be controlled by one or more memory controllers (e.g., the memory controller(s) may control the voltages applied to the components). Each of these sub-circuits may be controlled and/or biased by a one or more voltage sources, including but not limited to VSS, VARY, VHSA, and VDLB.

Precharge and boost circuit 405 may be coupled with (or in electronic communication with) the digit line 420 of a memory cell and may be configured to develop, and boost (e.g., via boost components 435), a signal representative of the logic state stored by the memory cell. Precharge and boost circuit 405 may include a subset of switching components (SCs), such as SC1 through SC5. A switching component may be referred to as "on" or "activated" when it is biased so that current flows from one terminal to the other. A switching component may be referred to as "off" or "deactivated" when it is biased so that current cannot flow from one terminal to the other.

Buffer circuit 410 may be coupled with precharge and boost circuit 405, sense component 415, and a reference voltage supply. Buffer circuit may be configured to develop (e.g., generate) and temporarily store voltages provided by the precharge and boost circuit 405 and the reference voltage supply. Buffer circuit 410 may include two source followers: first source follower 425-*a* and second source follower 425-*b*. Each source follower 425 may include a switching component. The source followers 425 may share a common node (e.g., a common drain, like shared node 430) so that any electrical signal present at the node is experienced by both source followers 425. The outputs of the source followers may be separated by a switching component (e.g., SC7) that remains deactivated during a sense operation. In some cases, a source follower may also be referred to as a voltage follower.

Each source follower 425 may be biased (e.g., by voltage source VDLB) so that a signal present at the input (e.g., at the gate) of the source follower 425 is replicated at the output (e.g., at the source) of the source followers 425. Thus, a first voltage that represents the digit line voltage may be replicated at the output of source follower 425-*a*, and a second voltage that represents the reference voltage may be replicated at the output of source follower 425-*b*. In this way, a first signal representative of the logic state of the memory cell may be generated by the first source follower 425-*a* and a second signal representative of the reference voltage may be generated by the second source follower 425-*b*. The voltage source VDLB may be configured to maintain the voltage of the node at a level that enables the source followers 425 to replicate input signals at their outputs. Because a source follower 425 replicates an input signal at its output, the amplitude (e.g., magnitude) of a signal output by a source follower 425 may be based on (e.g., a function of) the amplitude of the input signal.

Use of dual source followers 425 may allow concurrent generation of sensing voltages, which may reduce the latency and complexity of a sensing operation. For example, the first signal to be compared may be supplied to the first source follower 425-*a* as the same time, or nearly the same time, that the second signal to be compared is supplied to the second source follower 425-*b*. This is different than other sensing schemes in which the signals to be compared are provided to the buffer circuit 410 serially (e.g., one after the other). Use of the source followers 425 may also eliminate an external bias current required by other sense circuits to boost the digit line signal, which leads to additional advantages. This is because use of the source followers 425 allows the switching components SC6 to be configured so that they provide an internal bias current (e.g., by charge-sharing with the SA-a and SA-b nodes). Thus, the sense circuit 400 may be self-biasing.

The sense component 415 may be coupled to the first and second source followers 425 and may be configured to sense a difference between voltages provided by the source followers 425. For example, the sense component 415 may be configured to compare voltages present on node SA-a and node SA-b. According to the techniques described herein, the signal (e.g., voltage) that is present on SA-a may be representative of a logic state stored by the memory cell and the signal (e.g., voltage) that is present on SA-b may be representative of the reference voltage supplied by the reference voltage supply. Thus, the data signal on node SA-a may be provided by the first source follower 425-*a* and the reference signal on node SA-b may be provided by the second source follower 425-*b*. The sense component 415 may output a signal indicative of a logic '0' or a logic '1' based on a comparison of a data signal to a reference signal. The sense component 415 may be coupled with one or more voltage supplies, which may bias, activate, and/or deactivate the sense component 415. In some cases the sense component may be or include a sense amplifier that includes a latch.

In some cases, multiple switching components separate the sense component 415 from each source follower. In other cases, a single switching component separates each source follower from the sense component 415. In such cases, the sense component 415 may be coupled to the output of each source follower 425 via a single switching component. For example, a first switching component (e.g., SC6-*a*) may be coupled with the sense component 415 and the output of the first source follower 425-*a*. The first switching component may be configured to establish (e.g., when activated) a conductive path between the first source follower 425-*a* and the sense component 415. Similarly, a second switching component (e.g., SC6-*b*) may be coupled with the sense component 415 and the output of the second source follower 425-*b*. The second switching component may be configured to establish (e.g., when activated) a second conductive path between the second source follower 425-*b* and the sense component 415. In addition to establishing conductive paths to the sense component 415, the switching components SC6 may prevent the voltage on the SA nodes from exceeding a determined value (e.g., a value harmful to components of sense component 415).

Figure 5:
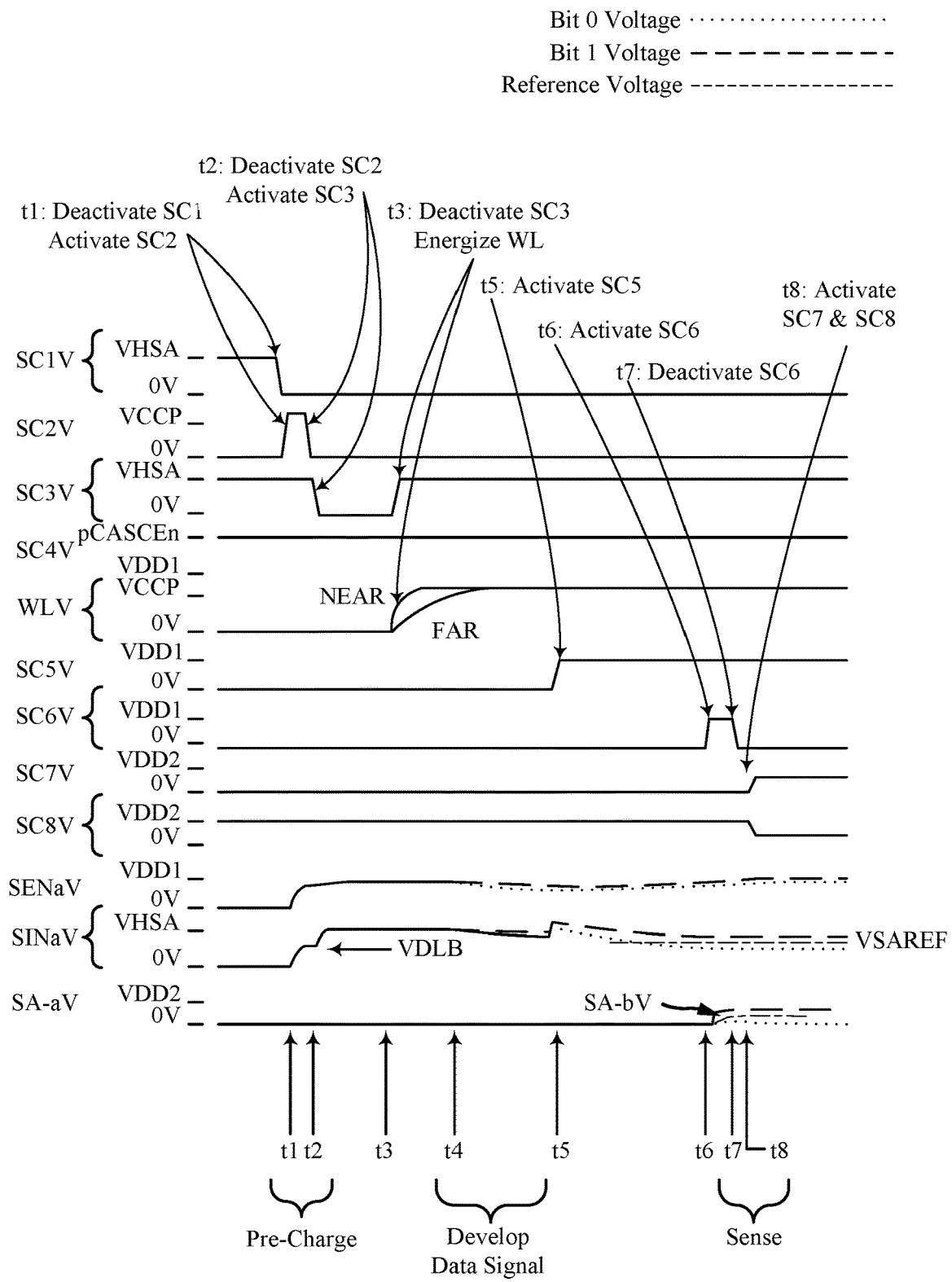
FIG. 5 shows a voltage plot that supports a source follower-based sensing scheme in accordance with various examples of the present disclosure.

FIG. 5 illustrates an example of an example voltage plot 500 that supports a source follower-based sensing scheme in accordance with various examples of the present disclosure. Voltage plot 500 depicts voltages applied to various components of sense circuit 400 as a function of time during a sensing operation of the sense circuit 400. For example, voltage plot 500 may include the voltage applied to switching component SC1 (referred to as SC1V), the voltage applied to switching component SC2 (referred to as SC2V), and so on and so forth. SC6V may refer to the voltage applied to both SC6-*a* and SC6-*b*. Voltage plot 500 may also include the voltage applied to the word line corresponding to the memory cell with digit line 420. The voltages applied in voltage plot 500 may, in some cases, be controlled by one or more memory controllers.

Voltage plot 500 also depicts voltages developed by or at various components (or nodes) of sense circuit 400 as a function of time (e.g., during a sensing operation of sense circuit 400). For example, voltage plot may depict voltage developed at (e.g., generated at) node SENa, node SINa, node SA-a, and node SA-b. These voltages may be referred to as SENaV, SINaV, SA-aV, and SA-bV, respectively. The voltages applied and developed may vary in amplitude from negative voltages to positive voltages, including virtual ground (e.g., 0V), VCCP (e.g., ~3.1 V), VDD1 (e.g., ~1.8 V), VDD2 (e.g., ~1.05 V), VHSA (e.g., ~2.5 V), and VDLB (e.g., ~1.5 V).

The voltages applied and developed may vary based on the type of switching components (e.g., n-type versus p-type) used in sense circuit 400. So although in some cases decreasing a voltage may activate a particular switching component in sense circuit 400, in other cases a similar result could be achieved by increasing the voltage applied to that switching component (e.g., if the switching component has an opposite polarity).

Leading up to time t1, the switching components may be biased so that SC4 is activated and so that SC1, SC2, SC3, SC5, SC6, SC7, and SC8 are deactivated. In one example, the voltages applied to the components are as follows: SC1V is at VHSA, SC2V is at 0V, SC3V is at VHSA, SC4V is at pCASEn, WLV is at 0V, SC5V is at 0V, SC6 is at 0V, SC7V is at 0V, and SC8V is at VDD2. When SC4 is in an activated state, charge (e.g., current) may flow between the digit line 420 and node SENa (e.g., SC4 may establish a conductive path between the digit line 420 and node SENa).

At time t1, the precharge and boost circuit 405 may perform a first step (e.g., of an example two-step pre-charge process) by deactivating switching component SC1 and activating switching component SC2. The pre-charge process may generate or develop a voltage on SINa that facilitates the sense operation. SC1 may be deactivated by applying a low voltage (e.g., 0V) to its gate and SC2 may be activated by applying a high voltage (e.g., VCCP) to its gate. Deactivating SC1 may isolate node SENa from a ground or negative voltage source (e.g., VSS). Activating SC2 may establish a conductive path that enables node SINa to charge up to a first voltage level (e.g., VDLB). Because SC4 is also activated, the voltage on node SENa may track the voltage on node SINa (e.g., node SENa may also charge up to the first level). However, SC4 may be configured so that the voltage on node SENa is limited to a determined value.

Once node SINa has been charged to the first voltage level, the precharge and boost circuit 405 may perform a second step (e.g., of a pre-charge process) by deactivating SC2 and activating SC3. Thus, at time t2 the voltage applied to SC2 may be reduced (e.g., SC2V may be reduced to 0V) so that SC2 is deactivated and the voltage applied to SC3 may be reduced (e.g., SC3V may be reduced from VHSA to 0V) so that SC3 is activated. Although shown occurring contemporaneously, the deactivation of SC2 may be slightly offset from (e.g., occur before or after) the activation of SC3. Deactivating SC2 may isolate node SINa from voltage source VDLB. Activating SC3 may establish a conductive path that enables node SINa to charge up to a second voltage level that is higher than the first voltage level (e.g., SINa may charge up to VHSA). However, the configuration of SC4 may prevent the voltage on node SENa from reaching the second voltage (e.g., SENaV may be limited to a value below VHSA). Limiting the voltage on SENa in this manner may save current. The two-step pre-charging process may also conserve power because node SINa draws less current from voltage source VHSA (Because the voltage at node SINa starts at a non-zero voltage).

After completing the pre-charge process (or in some cases, without completing pre-charge process), the word line corresponding to the selected memory cell may be energized so that the memory cell discharges onto the digit line 420. For example, at time t3 the word line voltage WLV may be driven to a high level (e.g., VCCP) while SC3 is deactivated. The signal output by the memory cell may be a voltage that is representative of the logic state stored by the memory cell. Because SC4 continues to be activated, the digit line voltage that appears on SENa may be shared with node SINa. Thus, nodes SENa and SINa may, beginning at time t4, charge (or discharge) to the digit line voltage. If the memory cell stored a logic 1, node SENa and node SINa may charge (or discharge) to a higher level than if the memory cell stored a logic 0.

Thus, a voltage based on (e.g., representative of) the voltage on the digit line 420 may be supplied to the first source follower 425-*a* via node SINa. A voltage based on (e.g., representative of) the reference voltage generated by the reference voltage supply may be supplied to the second source follower 425-*a*. As described herein, the voltages may be supplied concurrently. Because a signal present at the input of a source follower is replicated at the output, the first source follower 425-*a* may generate a first signal that is representative of the logic state of the memory cell. Similarly, the second source follower 425-*b* may generate a second signal that is representative of the reference voltage. Because the voltage are supplied to the source followers concurrently, the first and second signals may be generated concurrently.

At time t5, switching component SC5 may be activated (e.g., SCSV may be increased from 0V to VDD1). Activating SC5 may provide additional amplification between the voltage levels representing the logic states of the memory cell. For example, activating SC5 may shift the voltage on node SINa up as it continues to track the voltage on node SENa. When this happens, the signal representative of a logic 0 on node SINa may be pulled lower by a greater amount than the signal representative of a logic 1. Thus, the split between the two signals (also referred to as the sense window) may be increased, which may improve sensing accuracy. Increasing the SINaV voltage, and thus increasing the sense window, may be referred to as "boosting."

After a threshold amount of time has elapsed since activation of SC5, or after the boosted voltage on SINa reaches equilibrium (e.g., after the voltage on SINa remains within a threshold distance of determined value for a threshold amount of time), the signals output by the source followers 425 may be transferred to the sense component 415. For example, the first signal generated by source follower 425-*a* may be transferred to sense component 415 and the second signal generated by source follower 425-*b* may also be transferred to sense component 415. Thus, a signal representative of the digit line voltage may develop on node SA-a and a signal representative of the reference voltage may develop on node SA-b. The voltage developed on (or transferred to) node SA-a may be higher when the memory cell stores a logic 1 than the voltage that develops when the memory cell stores a logic 0. And the reference voltage (SA-bV) may be between the two voltages.

The transfer of the first and second signals to the sense component 415 may be concurrent (e.g., overlap at least partially in time). In some cases, the signals may be transferred by activating sets of switching components in diode configurations (e.g., as described with reference to FIGS. 8 and 9). In other cases, the signals may be transferred by activating switching components SC6-*a* and SC6-*b*. For example, at time t6, SC6V may be increased so that a conductive path is established between each source follower 425 and sense component 415. Thus, the sense component 415 may receive a first signal (e.g., representative of the digit line signal) from the first source follower 425-*a* over a first conductive path and may receive a second signal (e.g., representative of the reference signal) from the second source follower 425-*b* over a second conductive path. In the cases, that use switching components SC6, the voltage applied to SC6-*a* and SC6-*b* may be an analog voltage that is selected so that the SA nodes do not charge beyond a threshold value (e.g., a value above which the components of sense component 415 would risk damage).

Once the voltages on SA-a and SA-b reaches an equilibrium, or after a threshold amount of time has elapsed since activation of SC6, SC6 may be deactivated and the sense component 415 may be activated. For example, at time t7 the sense component 415 may be activated by increasing the SC7V and SC8V so that SC7 and SC8 are activated, respectively. SC6 may be deactivated prior to activating the sense component 415. When activated, the sense component 415 may sense the voltage difference between two voltages present on nodes SA-a and SA-b. So in this example, sense component 415 may sense the voltage difference between the first signal received from the first source follower 425-*a* and the second signal received from the second source follower 425-*b*. Thus, sense component 415 may determine the logic state of the memory cell.

Figure 6:
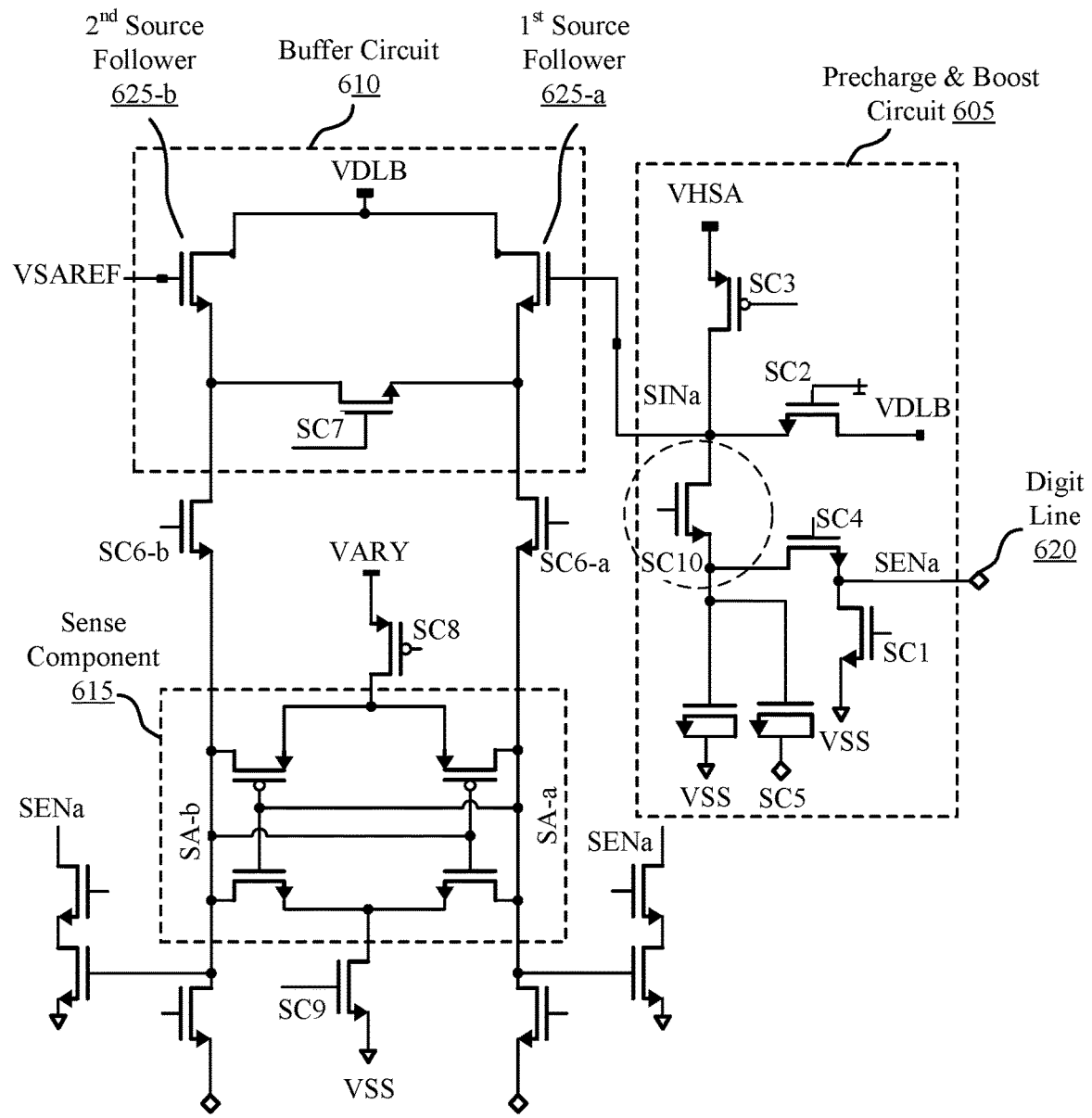
FIG. 6 illustrates an example of a sense circuit that supports a source follower-based sensing scheme in accordance with examples of the present disclosure.

FIG. 6 illustrates an example of a sense circuit 600 that supports a source follower-based sensing scheme accordance with various examples of the present disclosure. Components of the circuit 600 may be examples of the corresponding components (e.g., precharge and boost components) described with reference to FIGS. 1 through 4. Sense circuit 600 may include a precharge and boost circuit 605, a buffer circuit 610, and a sense component 615. These components may, in some cases, be controlled by one or more memory controllers (e.g., the memory controller(s) may control the voltages applied to the components).

Compared to precharge and boost circuit 405, precharge and boost circuit 605 may include an additional switching component, SC10, that is coupled with the first source follower 625-*a* and configured to amplify the sense window. In some examples, the switching component SC10 may be between node SINa and node SENa (or, put another way, between the second source follower 625-*a* and the digit line 420).

The switching component SC10 may be activated during most of a sensing operation so that the voltage on node SINa tracks (e.g., matches or follows) the voltage on node SENa. However, the switching component SC10 may be deactivated just before the source followers 625 are enabled (e.g., just before SC6-*a* and SC6-*b* are activated) so that the voltage on node SINa shifts down. Due to the configuration of precharge and boost circuit 605, there will be a down-shift for a logic 0 than for a logic 1. Thus, activating switching component SC10 may increase the sense window.

Figure 7:
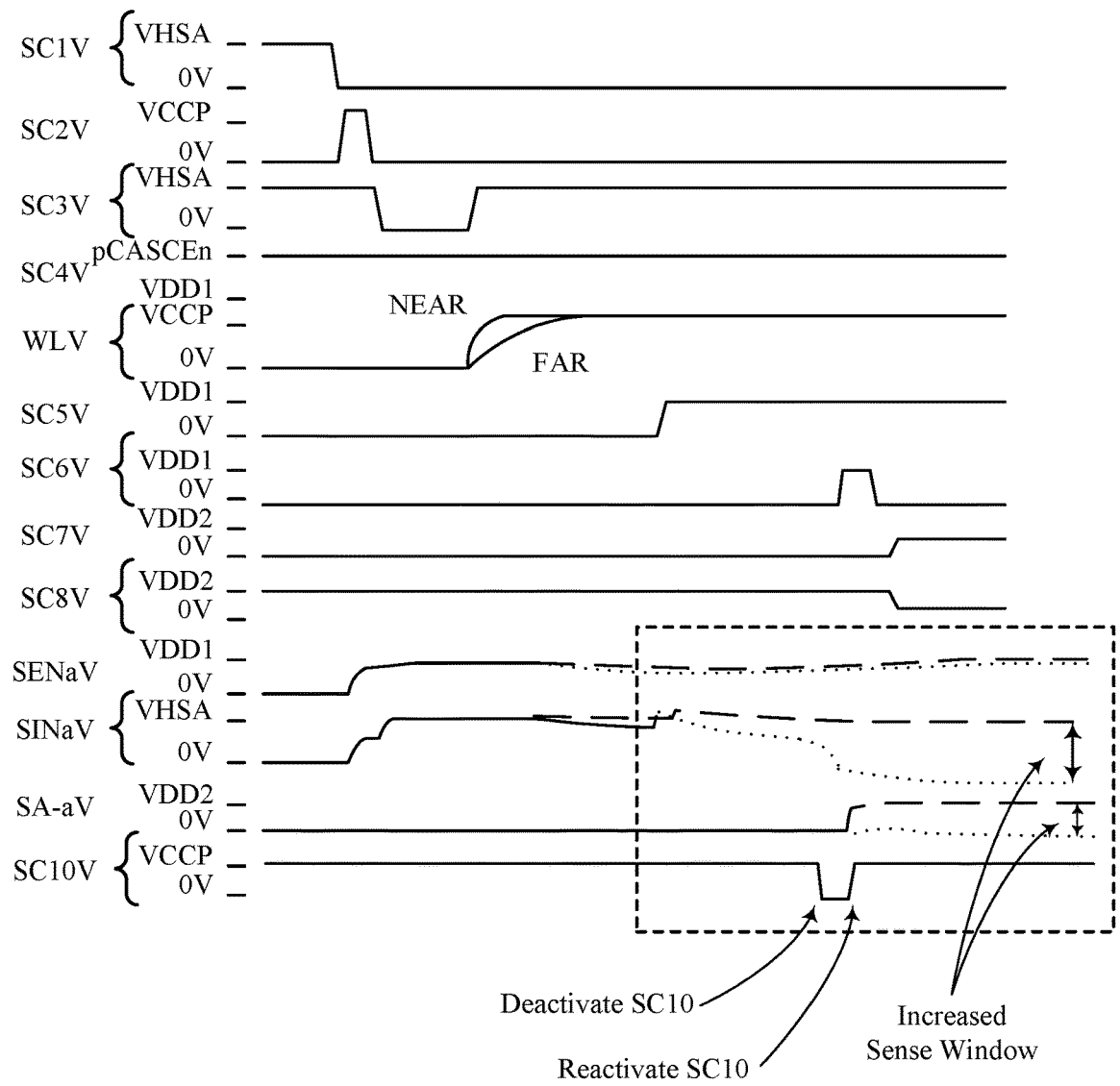
FIG. 7 shows a voltage plot that supports a source follower-based sensing scheme in accordance with various examples of the present disclosure.

FIG. 7 illustrates an example of an example voltage plot 700 that supports a source follower-based sensing scheme in accordance with various examples of the present disclosure. Voltage plot 700 depicts voltages applied to various components of sense circuit 600 as a function of time during a sensing operation of the sense circuit 600. Voltage plot 700 may mirror voltage plot 500, with at least the following exceptions.

After boosting the signals on node SINa and SENa (e.g., after time t5 in voltage plot 500) and before transferring the source follower outputs to the sense component (e.g., before time t6 in voltage plot 500), switching component SC10 may be deactivated for a period of time. Switching component SC10 may be deactivated by decreasing the voltage applied to it (e.g., by decreasing SC10V from VCCP to 0V). Prior to deactivating SC10, the voltage on node SINa may track the voltage on node SENa (due to the conductive path established by an active SC10). But when SC10 is deactivated, the voltage on node SINa may cease to track with the voltage on node SENa (because the conductive path has been cut-off, leaving node SINa isolated from node SENa). Instead, the voltage on SINa may shift down. Because the shift down may be larger for a logic 0 than for a logic 1, the sense window may increase.

After switching component SC10 has been deactivated for the period of time, it may be re-activated (e.g., by decreasing SC10V from VCCP to ground). At this point, the source followers 625 may be connected to the sense component 615 so that the sensing voltages can be transferred for comparison. Because the sense window has been increased, the sensing operation may be more accurate and reliable (e.g., compared to the sense operation associated with voltage plot 500 and sense circuit 400).

Figure 8:
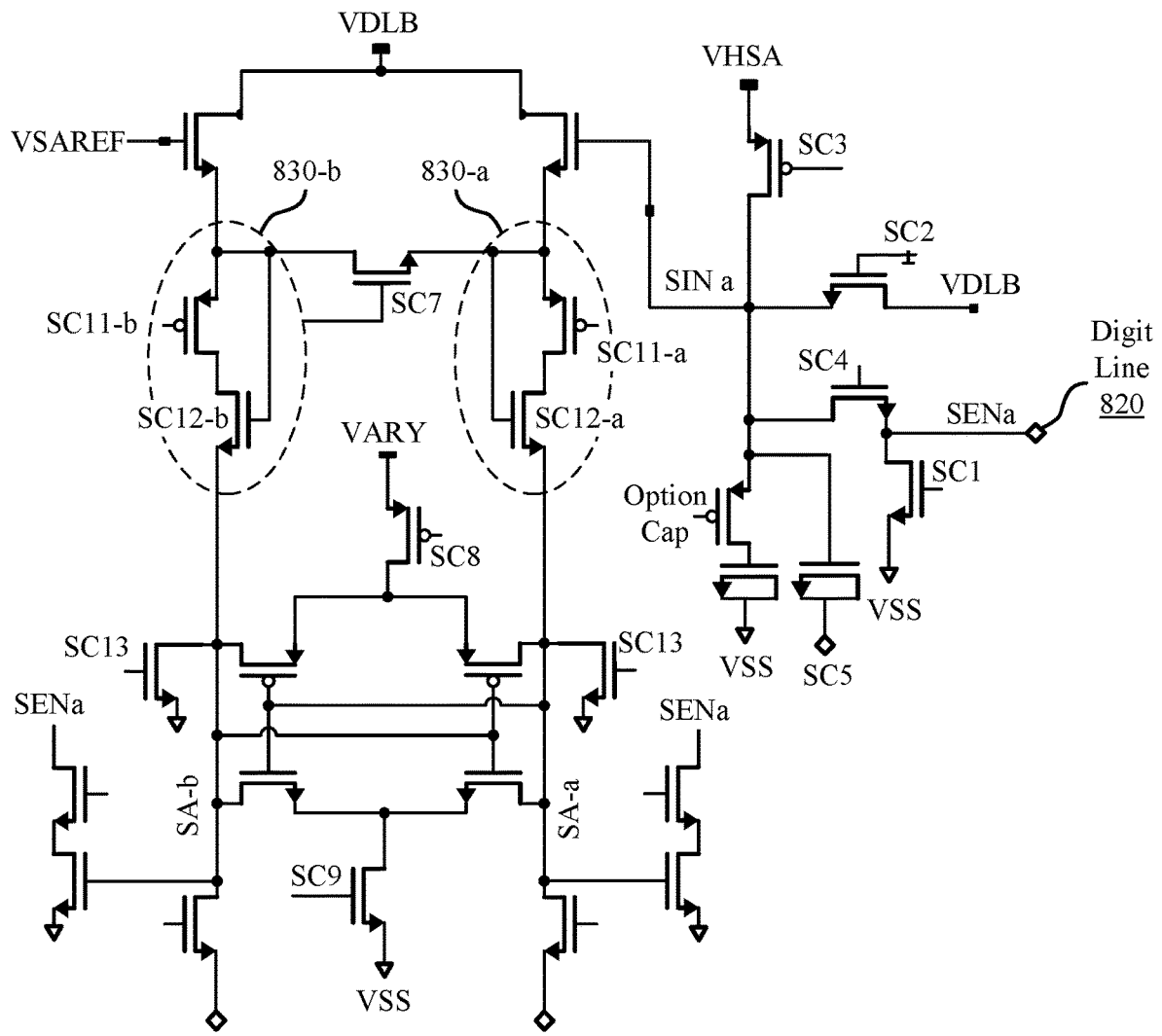
FIG. 8 illustrates an example of a sense circuit that supports a source follower-based sensing scheme in accordance with examples of the present disclosure.

FIG. 8 illustrates an example of a sense circuit 800 for a source follower-based sensing scheme in accordance with various examples of the present disclosure. Components of the circuit 800 may be examples of the corresponding components described with reference to FIGS. 1, 2, 3, 4, and 6. Sense circuit 800 may include a precharge and boost circuit, a buffer circuit, and a sense component. These components may, in some cases, be controlled by one or more memory controllers (e.g., the memory controller(s) may control the voltages applied to the components).

Compared to sense circuit 400, sense circuit 800 may include a two pairs of switching components configured as diodes. Each pair of switching components may include switching components of opposite polarities or types.

The first pair of switching components, referred to as diode configuration 830-a, may include a first switching component SC11-a (e.g., a p-type switching component) coupled with a second switching component SC12-a (e.g., an n-type switching component). The first switching component SC11-a and the second switching component SC12-a may share a first set of common nodes (e.g., the source of SC11-a may share a common node with the grate of SC12-a, and the drain of SC11-a may share a common node with the drain of SC12-a). The first switching component SC11-a and the second switching component SC12-a may be between the output of the first source follower 825-a and an input of the sense component 820.

The second pair of switching components, referred to as diode configuration 830-b, may include a third switching component SC11-b (e.g., a p-type switching component) coupled with a fourth switching component SC12-b (e.g., an n-type switching component). The third switching component SC11-b and the second switching component SC12-b may share a second set of common nodes (e.g., the source of SC11-b may share a common node with the grate of SC12-b, and the drain of SC11-b may share a common node with the drain of SC12-b). The third switching component SC11-b and the fourth switching component SC12-b may be between the output of the second source follower 825-b and an input of the sense component 820.

Like the switching components SC6 in sense circuit 600, the diode configurations 830 may be used to 1) transfer signals output from the source followers 825 to the sense component 815 and 2) limit the voltage on the SA nodes. For example, when activated, the diode configurations 830 may not only establish a conductive path between the source followers 825 and the sense component 815 but also limit the charge that can accumulate on node SA-a and node SA-b. When deactivated the diode configurations may isolate the source followers from the sense component 815. Diode configurations 830 may reduce the complexity of controlling sense circuit 800 because, unlike switching components SC6, diode configurations 830 may achieve both signal transfer and voltage limitation while being controlled by digital voltage levels (as opposed to analog voltage levels). Thus, a low level of voltage may turn the diode configurations 830 on (and limit the voltage on the SA nodes) and a high level of voltage may turn the diode configurations 830 off.

Figure 9:
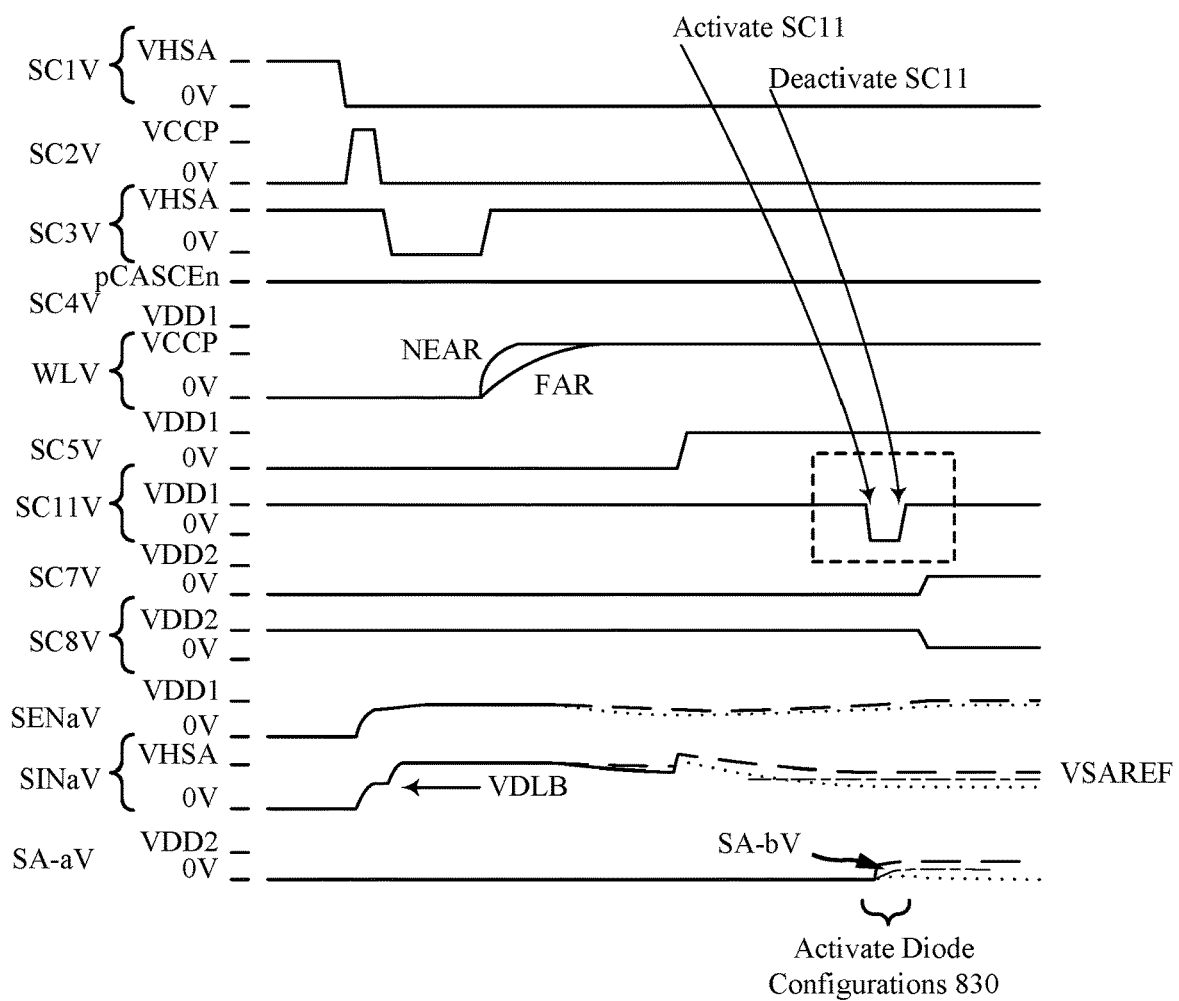
FIG. 9 shows a voltage plot that supports a source follower-based sensing scheme in accordance with various examples of the present disclosure.

FIG. 9 illustrates an example of an example voltage plot 900 that supports a source follower-based sensing scheme in accordance with various examples of the present disclosure. Voltage plot 900 depicts voltages applied to various components of sense circuit 800 as a function of time during a sensing operation of the sense circuit 800. Voltage plot 900 may include parts of voltage plot 700, and may mirror voltage plot 500 with at least the following exceptions.

Voltage plot 900 depicts the voltage applied to switching components SC11, which may be referred to as SC11V. After developing the signals at the outputs of the source followers 825 (e.g., after time t5 in voltage plot 500), and before firing the sense component 820 (e.g., before time t7 in voltage plot 500), the voltage applied to switching components SC11 may be decreased for a period of time so that the diode configurations 830 may be activated. For example, SC11V may be decreased from VDD1 to ground so that diode configurations 830 establish conductive paths between the source followers 825 and the sense component 820. Thus, a signal representative of the digit line voltage may be transferred to the sense component 820 at the same time, or nearly the same time, that a signal representative of the reference voltage is transferred to the sense component 820. However, the diode configurations 830 may prevent the signals from reaching levels that are harmful to the sub-components of sense component 820.

Figure 10:
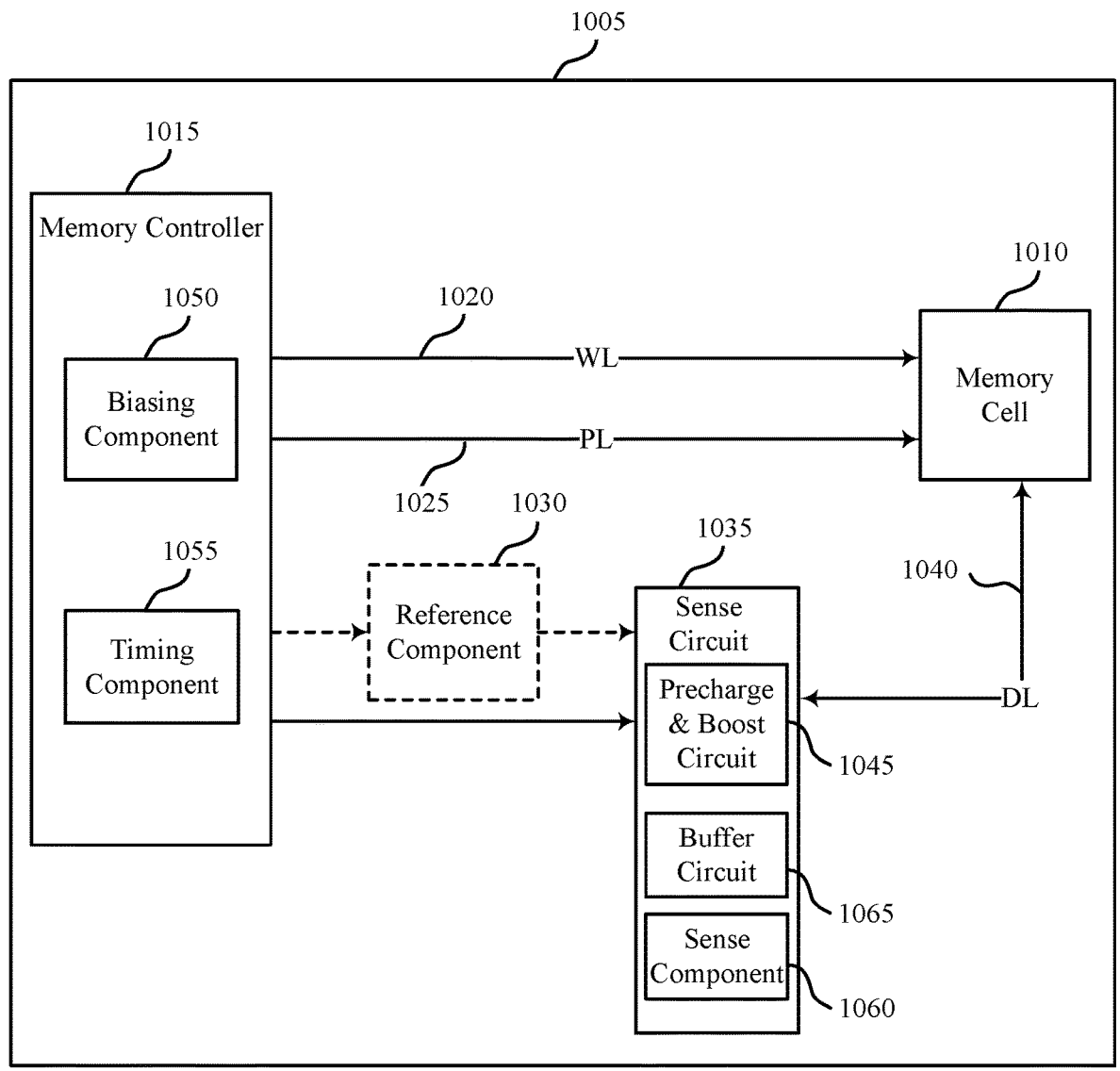
FIG. 10 shows a block diagram of a memory device that may support a source follower-based sensing scheme in accordance with various examples of the present disclosure.

FIG. 10 shows a block diagram 1000 of a memory device 1005 that supports a source follower-based sensing scheme in accordance with various examples of the present disclosure. Memory device 1005 may be referred to as an electronic memory apparatus, and may be an example of a component of a memory device 100 as described with reference to FIG. 1.

The memory device 1005 may include one or more memory cells 1010, which may be an example of memory cells 105 or a memory array 110 described with reference to FIGS. 1 through 9. The memory device 1005 may also include a memory controller 1015, a word line 1020, a plate line 1025, a sense circuit 1035, and a digit line 1040. These components may be in electronic communication with each other and may perform one or more of the functions described herein. In some cases, the memory controller 1015 may include a biasing component 1050 and a timing component 1055.

The memory controller 1015 may be in electronic communication with the word line 1020, the plate line 1025, the digit line 1040, and the sense circuit 1035, which may be examples of a word line, a plate line, a digit line, and a sense circuit described with reference to FIGS. 1 through 9. The components of the memory device 1005 may be in electronic communication with each other and may perform examples of the functions described with reference to FIGS. 1 through 9. In some cases, the sense circuit 1035 may be a component of memory controller 1015.

The memory controller 1015 may be an example of a memory controller as described herein, and may be configured to activate (e.g., energize) the word line 1020, the plate line 1025, or the digit line 1040 by applying voltages to various nodes. For example, the biasing component 1050 may be configured to apply a voltage to operate the memory cell 1010 to read or write the memory cell 1010 as described above. In some cases, the memory controller 1015 may include or otherwise communicate with a row component 125, a column component 135, a plate component 145, or a combination thereof, as described with reference to FIGS. 1 and 2, which may enable the memory controller 1015 to access one or more memory cells 1010. The biasing component 1050 may provide voltages (e.g., voltage sources) for coupling with the memory cell 1010 and other components of memory device 1005. For example, the biasing component 1050 may provide voltages (e.g., voltage sources) for the operation of the sense circuit 1035 or the reference component 1030.

In some cases, the memory controller 1015 may perform one or more of its operations using the timing component 1055. For example, the timing component 1055 may control the timing of the various word line selections or plate biasing, including timing for switching and voltage application to perform the memory functions, such as reading and writing, discussed herein. The timing component 1055 may also control the timing of voltage application to various components of sense circuit 1035 (e.g., in accordance with operations described with reference to voltage plots 500, 700, or 900 of FIGS. 5, 7, and 9). In some cases, the timing component 1055 may control the operations of the biasing component 1050.

Reference component 1030 may include various components and circuitry to generate (e.g., produce) a reference signal (e.g., a reference voltage) for sense circuit 1035. In some cases, reference component 1030 may be other ferroelectric memory cells. In some examples, reference component 1030 may be configured to output a voltage with a value between the two sense voltages, as described with reference to FIG. 3. Or reference component 1030 may be designed to output a virtual ground voltage (i.e., approximately 0V).

The sense circuit 1035 may compare a signal from a memory cell 1010 (e.g., provided via digit line 1040) with a reference signal (e.g., from the reference component 1030). Upon determining the logic state, the sense circuit 1035 may then store the output in a latch, where it may be used in accordance with the operations of an electronic device that may include the memory device 1005.

The memory controller 1015, or its sub-components, may be implemented in hardware, code (e.g., software, firmware) executed by a processor, or any combination thereof. If implemented in code executed by a processor, the functions of the memory controller 1015, or its sub-components, may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The memory controller 1015, or its sub-components, may be physically located at various positions, including being distributed such that portions of functions are implemented at different physical locations by one or more physical devices. In some examples, the memory controller 1015, or its sub-components, may be a separate and distinct component in accordance with various examples of the present disclosure. In other examples, the memory controller 1015, or its sub-components, may be combined with one or more other hardware components, including but not limited to an I/O component, a transceiver, a network server, another computing device, one or more other components described in the present disclosure, or a combination thereof in accordance with various examples of the present disclosure. The memory controller 1015 may be an example of the memory controller described with reference to FIG. 12.

In some examples, the memory controller 1015, including any subcomponents thereof, may support the described examples of sensing memory cells using a source follower-base sense circuit 1035. The sense circuit 1035 may be an example of a sense circuit 400, 600, or 800 described with reference to FIGS. 4, 6, and 8. The sense circuit 1035 may include a precharge and boost circuit 1045, a buffer circuit 1065, and a sense component 1060, which may be examples of a precharge and boost circuit, buffer circuit, and sense component as described with reference to FIGS. 4 through 9.

The sense circuit 1035 may include a first source follower (e.g., source follower 425-*a*) that is coupled with a digit line (e.g., digit line 420) of a memory cell and that is configured to output a first signal that is representative of a logic state stored by the memory cell. The sense circuit 1035 may include a second source follower (e.g., source follower 425-*b*) that is coupled with a reference voltage supply (e.g., reference voltage supply 285) and that is configured to output a second signal that is representative of a reference voltage provided by the reference voltage supply (e.g., VSAREF). The second source follower may share a node (e.g., common node 430) with the first source follower. The sense circuit 1035 may also include a sense component (e.g., sense component 1060, which may be an example of sense component 415) that coupled with the first source follower and the second source follower and that is configured to sense a voltage difference between the first signal and the second signal.

In some examples, an input of the first source follower is coupled with the digit line and an input of the second source follower is coupled with the reference voltage supply. In some examples, the sense circuit includes a voltage source (e.g., VDLB) coupled with the node shared by the first source follower and the second source follower. The voltage source may be configured to maintain a voltage of the node at a level.

In some cases, the sense circuit 1035 also includes 1) a first switching component coupled with the sense component and an output of the first source follower and 2) a second switching component coupled with the sense component and an output of the second source follower. The first switching component may be configured to establish a conductive path between the first source follower and the sense component and the second switching component may be configured to establish a second conductive path between the second source follower and the sense component. In some examples, the first switching component and the second switching component may be an example of a switching component SC6, as described with reference to FIG. 4. In other cases, the first switching component and the second switching component may be an example of a switching component SC11, as described with reference to FIG. 8.

In some cases, the sense circuit 1035 includes a third switching component (e.g., SC12-a) coupled with the first switching component, and a fourth switching component (e.g., SC12-b) coupled with the second switching component. The first and third switching components may share a first set of common nodes and the second and fourth switching components may share a second set of common nodes.

In some examples, the sense circuit 1035 includes a switching component (e.g., SC10) coupled with the first source follower. The switching component may be between the first source follower and the digit line. In some examples, the sense circuit 1035 includes a switching component that coupled with the first and second source followers (e.g., SC7) and that is configured to isolate an output of the first source follower from an output of the second source follower.

Figure 11:
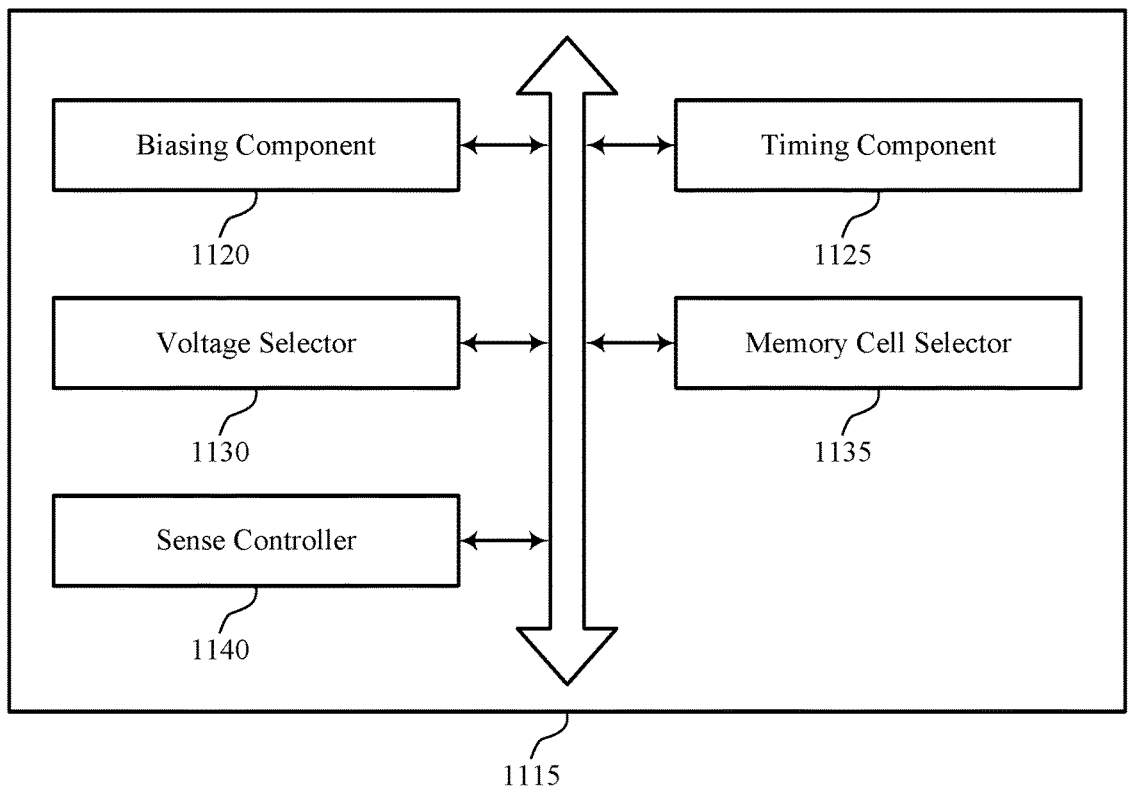
FIG. 11 shows a block diagram of a memory controller that may support a source follower-based sensing scheme in accordance with various examples of the present disclosure.

FIG. 11 shows a block diagram 1100 of a memory controller 1115 that may support a source follower-based sensing scheme in accordance with various examples of the present disclosure. The memory controller 1115 may be an example of a memory controller 170 described with reference to FIG. 1 or a memory controller 1015 described with reference to FIG. 10. The memory controller 1115 may include a biasing component 1120 and a timing component 1125, which may be examples of biasing component 1050 and timing component 1055 described with reference to FIG. 10. The memory controller 1115 may also include a voltage selector 1130, a memory cell selector 1135, and a sense controller 1140. Each of these modules may communicate, directly or indirectly, with one another (e.g., via one or more buses).

The biasing component 1120 may provide or supply (e.g., via one or more voltage sources) the biasing voltages for operation of a sense circuit as described herein. For example, the biasing component 1120 may generate the voltages used to bias the component or sub-circuits of sense circuit 400, such as VDLB and VHSA. In some cases, biasing component 1120 may also provide the voltage used to activate or deactivate various components of a sense circuit.

The timing component 1125 may control the timing of operations and voltage application (or removal) of various component of a memory controller 1115. For example, the timing component 1125 may dictate when the voltage applied to certain circuits, switching components, or nodes, is to be modified (e.g., increased or decreased). In some cases, the timing component 1125 may facilitate the timing of voltage application as described with reference to voltage plots 500, 700, and 900.

The voltage selector 1130 may initiate the selection of voltage sources to support various access operations of a memory device. For example, the voltage selector 1130 may generate or trigger control signals used to activate or deactivate various switching components or voltage sources, such as the control signals provided to the boost circuit, buffer circuit, and sense component as described with reference to FIGS. 4 through 9. The voltage selector 1130 may also generate one or more of the logical signals for selecting (e.g., enabling, disabling) the voltages of word lines, digit lines, or plate lines.

The memory cell selector 1135 may select a memory cell for access operations (e.g., read operations, write operations, rewrite operations, refresh operations, equalization operations, dissipation operations). In some examples, the memory cell selector 1135 may generate logical signals used to activate or deactivate a cell selection component, such as cell selection components 230 described with reference to FIG. 2. In some examples, the memory cell selector 1135 may initiate or otherwise control the word line voltages WLV illustrated in voltage plots 500, 700, and 900 described with reference to FIGS. 5, 7, and 9.

The sense controller 1140 may control various operations of a sense circuit, such as the sense circuits described with reference to FIGS. 4 through 9. For example, the sense controller 1140 may generate signals (e.g., voltages, such as SC1V through SC13V) used to activate or deactivate switching components within the sense circuit. Thus, in some examples, the sense controller 1140 may generate the signals of voltage plots 500, 700, or 900 described with reference to FIGS. 5, 7, and 9.

In some examples, the sense controller 1140 may determine the logic state stored by a memory cell based at least in part on sensing a voltage difference between two signals provided to its sense component. For example, the sense controller 1140 may (e.g., by using the sense component), sense a voltage difference between a first signal received from the first source follower and a second signal received from the second source follower. In some examples, the sense controller 1140 may provide signals to another component to determine the logic value associated with the memory cell.

Figure 12:
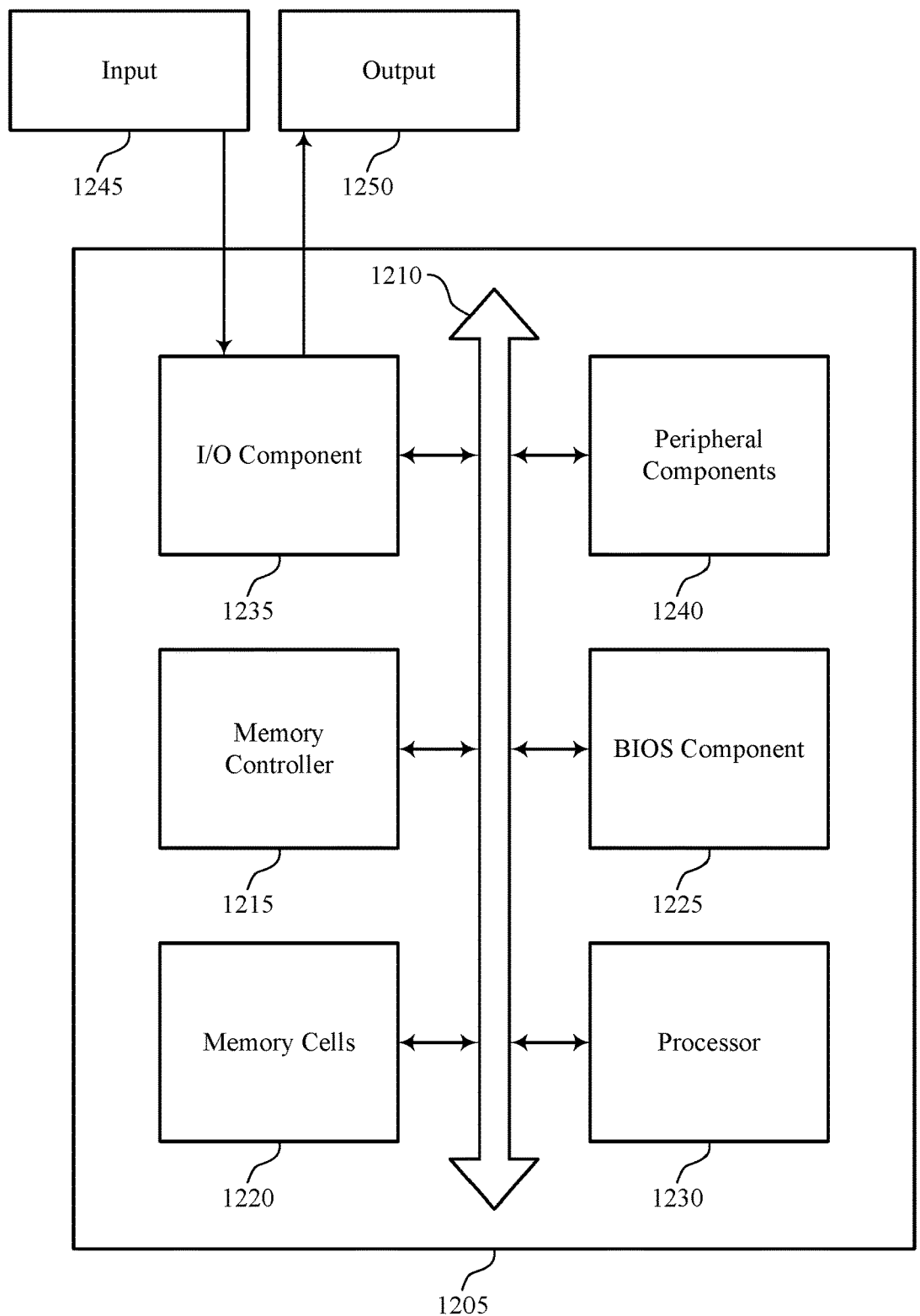
FIG. 12 shows a diagram of a system including a device that may support a source follower-based sensing scheme in accordance with various examples of the present disclosure.

FIG. 12 illustrates a system 1200 that supports a source follower-based sense circuit for sensing memory cells in accordance with various examples of the present disclosure. System 1200 includes a device 1205, which may be an example of or include the components of memory device 100 as described above, for example, with reference to FIG. 1. The device 1205 may include components for bi-directional communications including components for transmitting and receiving communications, including a memory controller 1215, memory cells 1220, a basic input/output system (BIOS) component 1225, a processor 1230, an I/O component 1235, and peripheral components 1240. These components may be in electronic communication via one or more busses (e.g., bus 1210).

The memory controller 1215 may operate one or more memory cells and sense circuits as described herein. Specifically, the memory controller 1515 may be configured to support the described sensing schemes for accessing memory cells. In some cases, the memory controller 1215 may include a row component, a column component, a plate component, or a combination thereof, as described with reference to FIG. 1.

The memory cells 1220 may be an example of memory cells 105 or 1010 described with reference to FIGS. 1 through 13, and may store information (e.g., in the form of a logic state) as described herein.

The BIOS component 1225 be a software component that includes BIOS operated as firmware, which may initialize and run various hardware components. The BIOS component 1225 may also manage data flow between a processor and various other components, such as peripheral components, I/O control components, and others. The BIOS component 1225 may include a program or software stored in read only memory (ROM), flash memory, or any other non-volatile memory.

The processor 1230 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component). In some cases, the processor 1230 may be configured to operate a memory array using a memory controller. In other cases, a memory controller may be integrated into the processor 1230. The processor 1230 may be configured to execute computer-readable instructions stored in a memory to perform various functions (e.g., functions or tasks supporting access schemes for protecting stored data in a memory device).

The I/O component 1235 may manage input and output signals for the device 1205. The I/O component 1535 may also manage peripherals not integrated into the device 1505. In some cases, the I/O component 1235 may represent a physical connection or port to an external peripheral. In some cases, the I/O component 1235 may utilize an operating system such as iOS®, ANDROID®, MS-DOS®, MS-WINDOWS®, OS/2®, UNIX®, LINUX®, or another known operating system. In other cases, the I/O component 1235 may represent or interact with a modem, a keyboard, a mouse, a touchscreen, or a similar device. In some cases, the I/O component 1235 may be implemented as part of a processor. In some cases, a user may interact with the device 1205 via the I/O component 1235 or via hardware components controlled by the I/O component 1235. The I/O component 1235 may support accessing the memory cells 1220, including receiving information associated with the sensed logic state of one or more of the memory cells 1220, or providing information associated with writing a logic state of one or more of the memory cells 1220.

The peripheral components 1240 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 1245 may represent a device or signal external to the device 1205 that provides input to the device 1205 or its components. This may include a user interface or an interface with or between other devices. In some cases, the input 1245 may be managed by the I/O component 1235, and may interact with the device 1205 via a peripheral component 1240.

The output 1250 may represent a device or signal external to the device 1205 configured to receive output from the device 1205 or any of its components. Examples of the output 1250 may include a display, audio speakers, a printing device, another processor or printed circuit board, or other devices. In some cases, the output 1250 may be a peripheral element that interfaces with the device 1205 via the peripheral component(s) 1240. In some cases, the output 1250 may be managed by the I/O component 1235.

The components of the device 1205 may include circuitry designed to carry out their functions. This may include various circuit elements, for example, conductive lines, transistors, capacitors, inductors, resistors, amplifiers, or other active or inactive elements, configured to carry out the functions described herein. The device 1205 may be a computer, a server, a laptop computer, a notebook computer, a tablet computer, a mobile phone, a wearable electronic device, a personal electronic device, or the like. Or the device 1205 may be a portion or element of such a device.

Figure 13:
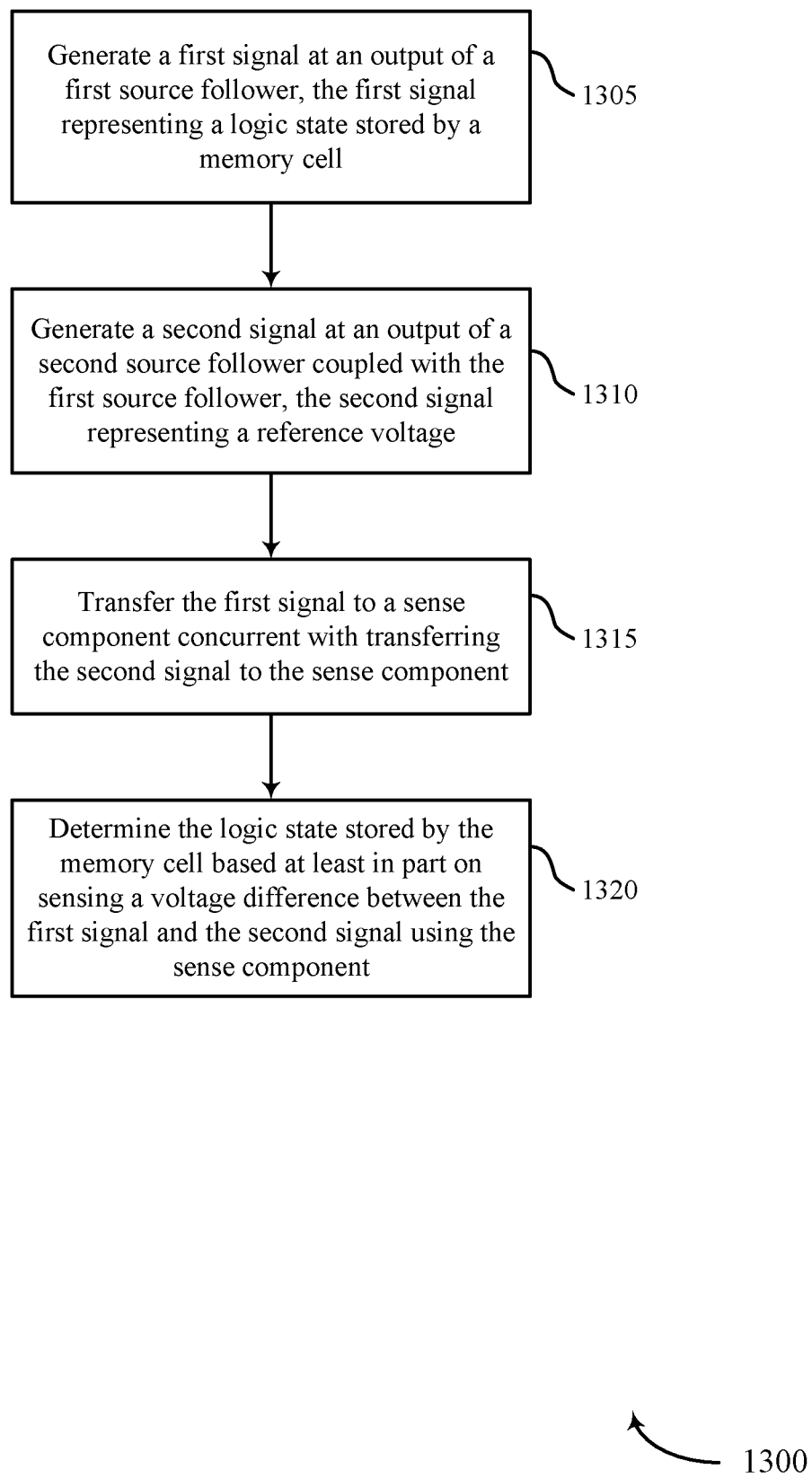
FIG. 13 shows a flowchart illustrating a method that may support a source follower-based sensing scheme in accordance with various examples of the present disclosure.

FIG. 13 shows a flowchart illustrating a method 1300 that supports a source follower-based sensing scheme in accordance with the present disclosure. The operations of method 1300 may be implemented by an apparatus or its components as described herein. For example, the operations of method 1300 may be performed by the sense circuit of a memory device as described with reference to FIGS. 1 through 9. In some examples, a memory controller may execute a set of instructions to control the functional elements of the memory device to perform the functions described below. Additionally or alternatively, a memory device may perform some or all of the functions described below using special-purpose hardware.

At 1305, the method may include generating a first signal at an output of a first source follower (e.g., source follower 425-a). The first signal may represent a logic state stored by a memory cell. The operations of 1305 may be performed according to the methods described herein. In some examples, some or all of the operations of 1305 may be performed by a buffer circuit as described with reference to FIGS. 4 through 8.

At 1310, the method may include generating a second signal at an output of a second source follower (e.g., source follower 425-b) coupled with the first source follower. The second signal may represent a reference voltage. In some cases, the first signal is generated concurrent with the second signal. For example, transference of the second signal may overlap at least partially in time with transference of the first signal. In some cases, the first source follower and the second source follower share a common node (e.g., node 430). The operations of 1310 may be performed according to the methods described herein. In some examples, some or all of the operations of 1310 may be performed by a buffer circuit as described with reference FIGS. 4 through 8.

At 1315, the method may include transferring the first signal to a sense component (e.g., sense component 415) concurrent with transferring the second signal to the sense component. The operations of 1315 may be performed according to the methods described herein. In some examples, some or all of the operations of 1315 may be performed by switching components (e.g., SC6, or SC11 and SC12) as described with reference to FIGS. 4 through 9.

At 1320, the method may include determining the logic state stored by the memory cell based at least in part on sensing a voltage difference between the first signal and the second signal using the sense component. The operations of 1320 may be performed according to the methods described herein. In some examples, some of the operations of 1320 may be performed by a sense component as described with reference to FIGS. 4 through 9.

In some examples, an apparatus as described herein may perform a method or methods, such as the method 1300. The apparatus may include features, means, or instructions (e.g., a non-transitory computer-readable medium storing instructions executable by a processor) for 1) activating a first switching component coupled with the first source follower and the sense component, and 2) activating a second switching component in coupled with the second source follower and the sense component. In such cases, transferring the first signal is based on activating the first switching component and transferring the second signal is based on activating the first switching component. The first and second switching components may be one of SC6, SC11, or SC12.

In some examples, the apparatus may include features, means, or instructions for 1) establishing a first conductive path between the first source follower and the sense component and 2) establishing a second conductive path between the second source follower and the sense component.

In some examples, the apparatus may include features, means, or instructions for deactivating a switching component (e.g., SC10) coupled with a digit line of the memory cell and the first source follower before transferring the first signal and the second signal. In some examples, the apparatus may include features, means, or instructions for modifying a voltage 25 (e.g., SCV2 or SCV3) applied to a first switching component coupled with the first source follower. In some cases, the first signal is developed based at least in part on modifying the voltage.

Figure 14:
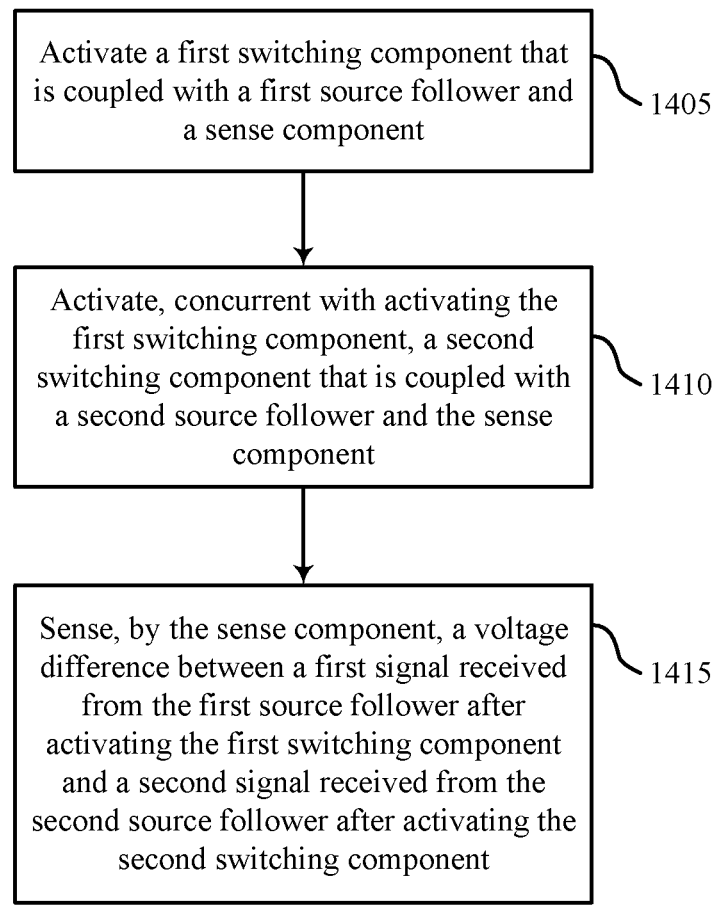
FIG. 14 shows a flowchart illustrating a method that may support a source follower-based sensing scheme in accordance with various examples of the present disclosure.

In some examples, the apparatus may include features, means, or instructions for 1) supplying the first source follower with a first voltage that is based at least in part on a voltage of a digit line of the memory cell and 2) supplying the second source follower with a second voltage that is based at least in part on the reference voltage. The amplitude of the first signal may be based at least in part on the first voltage and the amplitude of the second signal may be based at least in part on the second voltage FIG. 14 shows a flowchart illustrating a method 1400 that supports a source follower-based sensing scheme in accordance with the present disclosure. The operations of method 1400 may be implemented by an apparatus or its components as described herein. For example, the operations of method 1400 may be performed by the sense circuit of a memory device as described with reference to FIGS. 1 through 9. In some examples, a memory controller may execute a set of instructions to control the functional elements of the memory device to perform the functions described below. Additionally or alternatively, a memory device may perform some or all of the functions described below using special-purpose hardware.

At 1405, the method may include apparatus may include activating a first switching component (e.g., SC6-*a* or SC11-*a*) that is coupled with a first source follower (e.g., source follower 425-*a*) and a sense component (e.g., sense component 415). The operations of 1405 may be performed according to the methods described herein. In some examples, come or all of the operations of 1405 may be performed by a sense controller as described with reference to FIG. 11.

At 1410, the method may include activating, concurrent with activating the first switching component, a second switching component (e.g., SC6-*b* or SC11-*b*) that is coupled with a second source follower (e.g., source follower 425-*b*) and the sense component. The operations of 1410 may be performed according to the methods described herein. In some examples, some or all of the operations of 1410 may be performed by a sense controller as described with reference to FIG. 11.

At 1415, the method may include sensing, by the sense component, a voltage difference between a first signal received from the first source follower after activating the first switching component and a second signal received from the second source follower after activating the second switching component. The operations of 1415 may be performed according to the methods described herein. In some examples, some or all of the operations of 1415 may be performed by a sense component 415 as described with reference to FIGS. 4 through 9.

In some examples, an apparatus as described herein may perform a method or methods, such as the method 1400. The apparatus may include features, means, or instructions (e.g., a non-transitory computer-readable medium storing instructions executable by a processor) for reducing, before activating the first and second switching components, a voltage (e.g., SC10V) applied to a third switching component (e.g., SC10) that is coupled with the first switching component and a digit line of a memory cell.

In some cases, the first signal is received via a third switching component (e.g., SC12-*a*) that couples the first switching component to the sense component and the second signal is received via a fourth switching component (e.g., SC12-*b*) that couples the second switching component to the sense component. In some cases, the output of the first source follower and the output of the second source follower are separated from each other by the third switching component (e.g., SC7).

In some cases, the apparatus may include features, means, or instructions (e.g., a non-transitory computer-readable medium storing instructions executable by a processor) for modifying a first voltage applied to the first switching component and modifying a second voltage applied to the second switching component to activate the second switching component. Modifying the first voltage may activate the first switching component and establish a first conductive path between the first source follower and the sense component, while modifying the second voltage may activate the second switching component and establish a second conductive path between the second source follower and the sense component. Thus, the sense component may receive the first signal via the first conductive path and may receive the second signal via the second conductive path.

It should be noted that the methods described above describe possible implementations, and that the operations and the steps may be rearranged or otherwise modified and that other implementations are possible. Further, examples from two or more of the methods may be combined.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "terminal" need not suggest a physical boundary or connection point of a circuit element. Rather, "terminal" may refer to a reference point of a circuit relevant to the circuit element, which may also be referred to as a "node" or "reference point."

As used herein, the term "developing" or "generating" may refer to the process of causing a charge to flow so that a voltage potential occurs or arises at a node or terminal. The term "transferring" may refer to the process of causing charge to flow so that a voltage potential on one node arises at another node. The term "supplying" may refer to the process of providing a developed charge or voltage to a node, either directly from a voltage source or from another node where the charge has developed. As used herein, the phrase "concurrent with" may refer to two or more phenomenon happening at the same time. The occurrence of the phenomenon may overlap entirely or partially in time.

The devices discussed herein, including memory device 100, circuit 200, and circuit 400, described with reference to FIGS. 1, 2, and 4, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first source follower coupled with a digit line of a memory cell and configured to output a first signal that is representative of a logic state stored by the memory cell;
a first switching component coupled with a sense component and an output of the first source follower, the first switching component configured to establish a conductive path between the first source follower and the sense component;
a second source follower coupled with a reference voltage supply and configured to output a second signal that is representative of a reference voltage provided by the reference voltage supply, the second source follower sharing a node with the first source follower;
a second switching component coupled with the sense component and an output of the second source follower, the second switching component configured to establish a second conductive path between the second source follower and the sense component; and
the sense component coupled with the first source follower and the second source follower and configured to sense a voltage difference between the first signal and the second signal.

2. The apparatus of claim 1, further comprising:
a third switching component coupled with the first switching component, the first and third switching components sharing a first set of common nodes; and
a fourth switching component coupled with the second switching component, the second and fourth switching components sharing a second set of common nodes.

3. The apparatus of claim 1, further comprising:
a third switching component coupled with the first source follower, wherein the third switching component is between the first source follower and the digit line.

4. The apparatus of claim 1, further comprising:
a third switching component coupled with the first and second source followers and configured to isolate an output of the first source follower from an output of the second source follower.

5. An apparatus, comprising:
a first source follower coupled with a digit line of a memory cell and configured to output a first signal that is representative of a logic state stored by the memory cell, wherein an input of the first source follower is coupled with the digit line;
a second source follower coupled with a reference voltage supply and configured to output a second signal that is representative of a reference voltage provided by the reference voltage supply, wherein the second source follower shares a node with the first source follower and wherein an input of the second source follower is coupled with the reference voltage supply; and
a sense component coupled with the first source follower and the second source follower and configured to sense a voltage difference between the first signal and the second signal.

6. The apparatus of claim 1, further comprising:
a voltage source coupled with the node shared by the first source follower and the second source follower, the voltage source configured to maintain a voltage of the node at a level.

7. A method, comprising:
generating a first signal at an output of a first source follower, the first signal representing a logic state stored by a memory cell;

generating a second signal at an output of a second source follower coupled with the first source follower, the second signal representing a reference voltage;

activating a first switching component coupled with the first source follower and a sense component;

activating a second switching component coupled with the second source follower and the sense component;

transferring the first signal to a sense component concurrent with transferring the second signal to the sense component, wherein transferring the first signal is based on activating the first switching component and transferring the second signal is based on activating the second switching component; and determining the logic state stored by the memory cell based at least in part on sensing a voltage difference between the first signal and the second signal using the sense component.

8. The method of claim 7, wherein generating the first signal comprises: generating the first signal concurrent with generating the second signal.

9. The method of claim 7, further comprising:
establishing a first conductive path between the first source follower and the sense component; and
establishing a second conductive path between the second source follower and the sense component.

10. The method of claim 7, further comprising:
deactivating a third switching component coupled with a digit line of the memory cell and the first source follower before transferring the first signal and the second signal.

11. A method, comprising:
supplying a first source follower with a first voltage that is based at least in part on a voltage of a digit line of a memory cell;
generating a first signal at an output of the first source follower, wherein the first signal represents a logic state stored by the memory cell and wherein an amplitude of the first signal is based at least in part on the first voltage;
supplying a second source follower with a second voltage that is based at least in part on a reference voltage;
generating a second signal at an output of the second source follower, wherein the second source follower is coupled with the first source follower, the second signal represents the reference voltage, and an amplitude of the second signal is based at least in part on the second voltage;
transferring the first signal to a sense component concurrent with transferring the second signal to the sense component; and
determining the logic state stored by the memory cell based at least in part on sensing a voltage difference between the first signal and the second signal using the sense component.

12. The method of claim 7, further comprising:
modifying a voltage applied to a third switching component coupled with the first source follower, wherein the first signal is developed based at least in part on modifying the voltage.

13. The method of claim 7, wherein the first source follower and the second source follower share a common node.

14. The method of claim 7, wherein transferring the second signal overlaps at least partially in time with transferring the first signal.

15. A method, comprising:
modifying a first voltage applied to a first switching component that is coupled with a first source follower and a sense component, wherein modifying the first voltage activates the first switching component and establishes a first conductive path between the first source follower and the sense component;

modifying a second voltage applied to a second switching component that is coupled with a second source follower and the sense component, wherein modifying the second voltage activates the second switching component concurrent with activating the first switching component and establishes a second conductive path between the second source follower and the sense component; and sensing, by the sense component, a voltage difference between a first signal received from the first source follower after activating the first switching component and a second signal received from the second source follower after activating the second switching component.

16. The method of claim 15, further comprising:
reducing, before activating the first and second switching components, a voltage applied to a third switching component that is coupled with the first switching component and a digit line of a memory cell.

17. The method of claim 15, wherein the first signal is received via a third switching component that couples the first switching component to the sense component and the second signal is received via a fourth switching component that couples the second switching component to the sense component.

18. The method of claim 17, wherein an output of the first source follower and an output of the second source follower are separated from each other by the third switching component.

19. The method of claim 15, wherein receiving the first signal comprises receiving the first signal via the first conductive path and wherein receiving the second signal comprising is received via the second conductive path.

* * * * *